US012670300B2

(12) United States Patent
Phadke et al.

(10) Patent No.: US 12,670,300 B2
(45) Date of Patent: Jun. 30, 2026

(54) METHOD AND APPARATUS FOR RAPID APPROXIMATION OF SYSTEM MODEL

(71) Applicant: PHADKE ASSOCIATES, INC., Colts Neck, NJ (US)

(72) Inventors: Madhav S. Phadke, Colts Neck, NJ (US); Kedar M. Phadke, Colts Neck, NJ (US)

(73) Assignee: PHADKE ASSOCIATES, INC., Colts Neck, NJ (US)

( * ) Notice: Subject to any disclaimer, the term of this patent is extended or adjusted under 35 U.S.C. 154(b) by 0 days.

(21) Appl. No.: 17/155,958

(22) Filed: Jan. 22, 2021

(65) Prior Publication Data

US 2021/0141977 A1    May 13, 2021

Related U.S. Application Data

(63) Continuation of application No. 14/192,291, filed on Feb. 27, 2014, now abandoned.

(51) Int. Cl.
*G06F 30/20* (2020.01)

(52) U.S. Cl.
CPC .................................. *G06F 30/20* (2020.01)

(58) Field of Classification Search
CPC ....................................................... G06F 30/20
See application file for complete search history.

(56) References Cited

U.S. PATENT DOCUMENTS

| | | | |
|---|---|---|---|
| 6,643,610 B1 | 11/2003 | Kleven et al. |
| 8,190,537 B1 | 5/2012 | Singh et al. |
| 8,635,051 B1 | 1/2014 | Wu et al. |
| 2006/0212429 A1 | 9/2006 | Bruno et al. |
| 2009/0109195 A1 | 4/2009 | Kent et al. |
| 2009/0206972 A1 | 8/2009 | Tunay |
| 2010/0235362 A1 | 9/2010 | Cormode et al. |
| 2011/0257950 A1 | 10/2011 | Kirby et al. |
| 2014/0372091 A1 | 12/2014 | Larimore |

OTHER PUBLICATIONS

Lazic et al. Orthogonal Array application for optimal combination of software defect detection techniques choices. 2008. <URL:http://www.wseas.us/e-library/transaction/computers/2008/27-646.pdf. >entire document.
International Search Report and Written Opinion of PCT/US2015/017949, dated Jun. 3, 2015, pp. 1-18.
Miner et al. Using the exact state space of a Markov model to compute approximate stationary measures*. 2000. URL:http://www.cs.iastate.edu/~asminer/Site2/Pdfs/2000sigmetrics.pdf.> entire document.

*Primary Examiner* — Bijan Mapar
(74) *Attorney, Agent, or Firm* — MEAGHER, EMANUEL, LAKS, GOLDBERG & LIAO, LLP

(57) ABSTRACT

Systems, methods, apparatus and mechanisms that iteratively generate one or more equations (conforming to one or more functions or functions types) of increasing complexity (e.g., degree or order) to provide one or more corresponding approximations of a physical System Under Study (SUS), where each approximation or "fit" provides additional information about the SUS and where the various equations may be summed to provide a final "fit" having an adequate level of accuracy.

18 Claims, 20 Drawing Sheets

<u>210</u>
RECEIVE INPUT INFORMATION FROM USER, SOFTWARE MODULE, INTERFACE, OR SYSTEM, INCLUDING SUS INFORMATION, CONSTRAINT INFORMATION AND/OR OTHER INFORMATION

<u>220</u>
GENERATE A SIMPLIFIED MATHEMATICAL MODEL TO PROVIDE GOOD FIT APPROXIMATION OF SYSTEM UNDER STUDY (SUS).

<u>230</u>
- STORE/PROVIDE FINALIZED SUS-CHARACTERIZING MATHEMATICAL MODEL. TRANSMIT ANY PROCESS UPDATE MESSAGES.
- COMPUTE SUMMARY STATISTICS, PARAMETER EFFECTS, AND PARAMETER INTERACTION EFFECTS.
- COMPUTE SAVINGS RATIO AND/OR PERFORM OTHER POST PROCESSING COMPUTATION OR FUNCTION AS APPROPRIATE

<u>240</u>
STORE/PROVIDE SUMMARY STATISTICS IN FORMATS FOR USER AND SYSTEM CONSUMPTION, DISPLAY SUMMARY STATISTICS AND PARAMETER EFFECTS IN GRAPHICAL FORMATS, DISPLAY RESULTS VIA GRAPHICS OR OTHER PRESENTATION INFORMATION AND/OR PERFORM OR PROVIDE OTHER VISUALIZATION INFORMATION AS APPROPRIATE

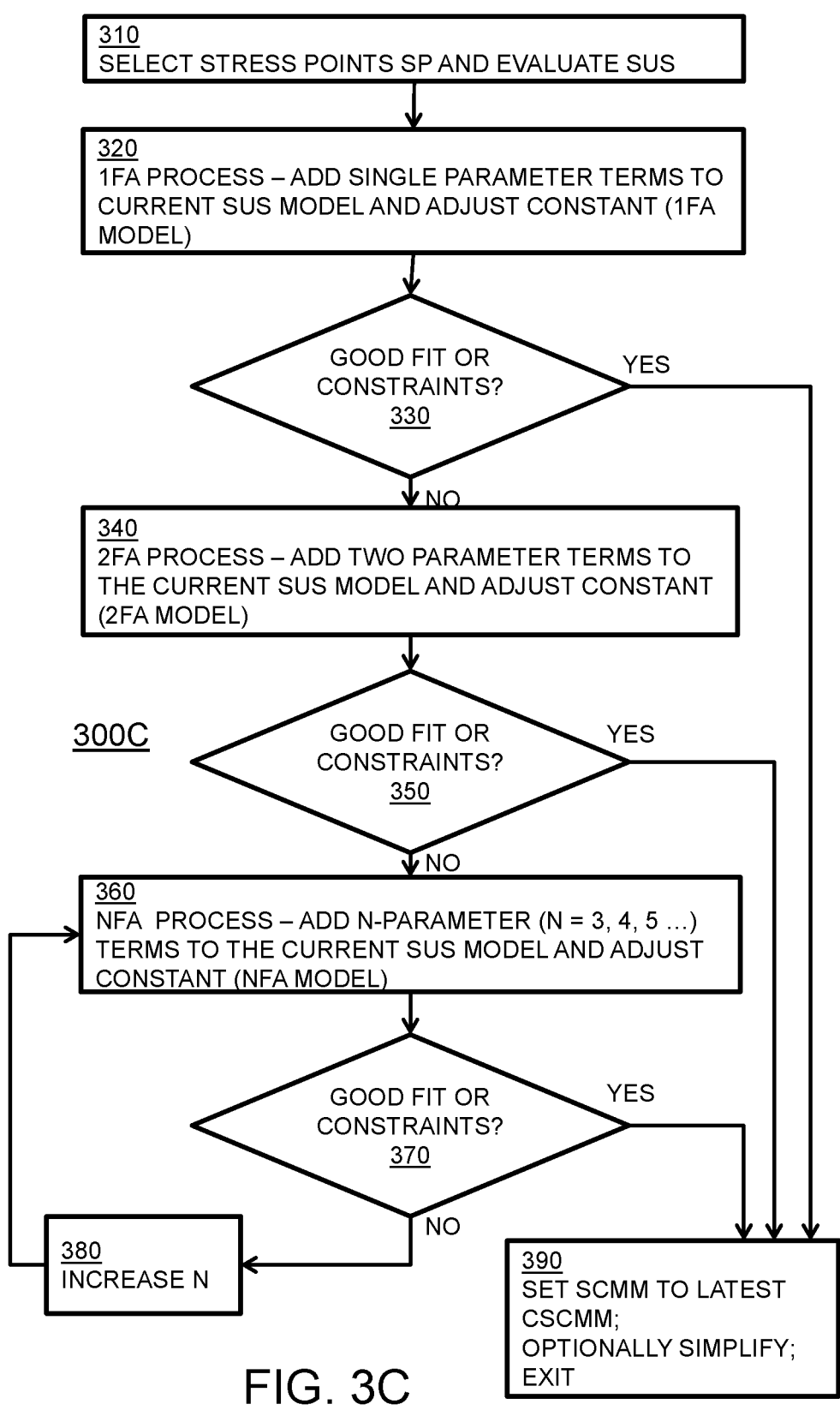

310
SELECT STRESS POINTS SP AND EVALUATE SUS 320
1FA PROCESS – ADD SINGLE PARAMETER TERMS TO
CURRENT SUS MODEL AND ADJUST CONSTANT (1FA
MODEL)

GOOD FIT OR
CONSTRAINTS?
330

YES

NO 340
2FA PROCESS – ADD TWO PARAMETER TERMS TO
THE CURRENT SUS MODEL AND ADJUST CONSTANT
(2FA MODEL)

300C

GOOD FIT OR
CONSTRAINTS?
350

YES

NO

360
NFA  PROCESS – ADD N-PARAMETER (N = 3, 4, 5 ...)
TERMS TO THE CURRENT SUS MODEL AND ADJUST
CONSTANT (NFA MODEL)

GOOD FIT OR
CONSTRAINTS?
370

YES

NO

380
INCREASE N

390
SET SCMM TO LATEST
CSCMM;
OPTIONALLY SIMPLIFY;
EXIT

FIG. 3C

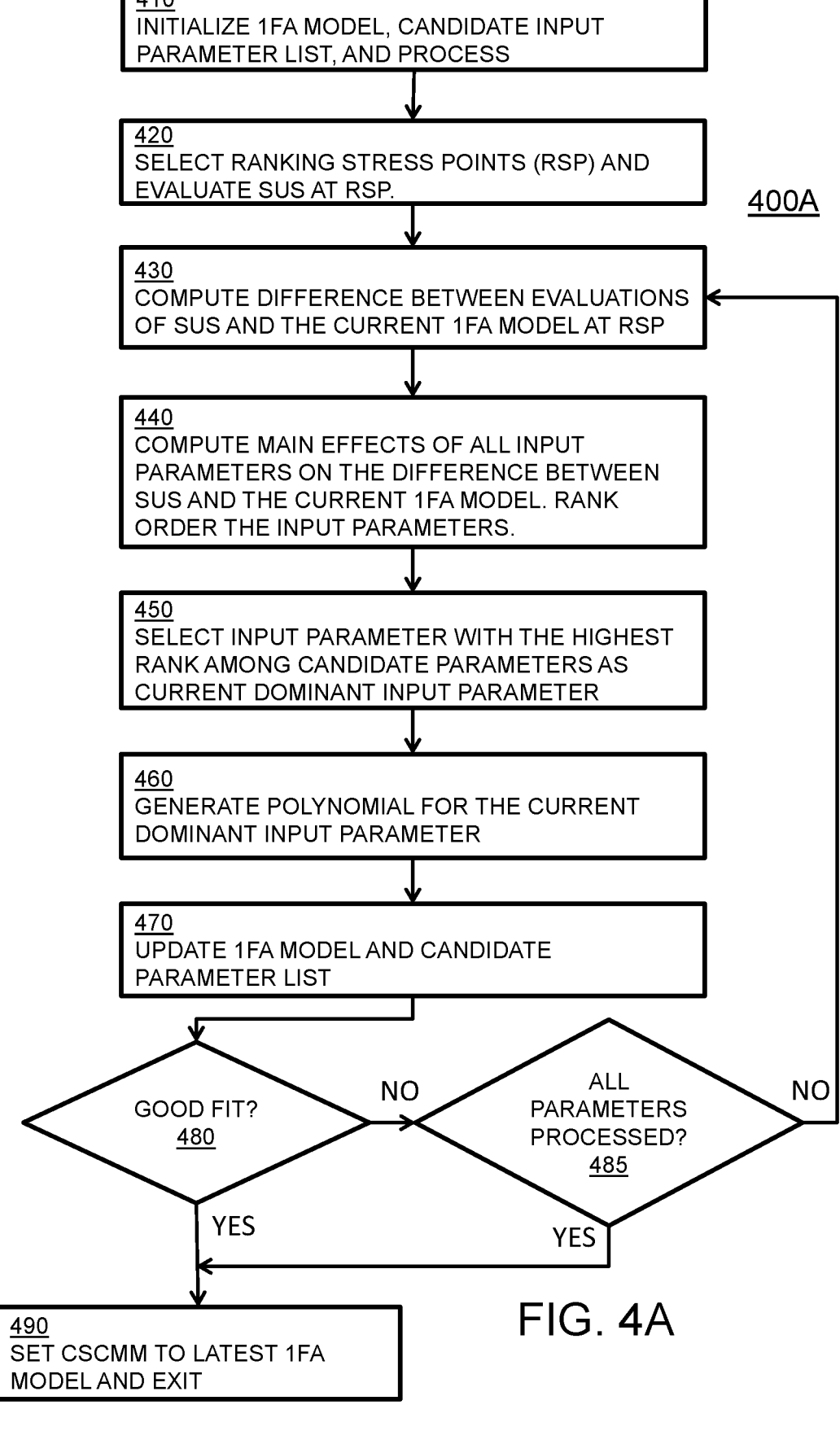

410
INITIALIZE 1FA MODEL, CANDIDATE INPUT
PARAMETER LIST, AND PROCESS

420
SELECT RANKING STRESS POINTS (RSP) AND
EVALUATE SUS AT RSP.

400A

430
COMPUTE DIFFERENCE BETWEEN EVALUATIONS
OF SUS AND THE CURRENT 1FA MODEL AT RSP

440
COMPUTE MAIN EFFECTS OF ALL INPUT
PARAMETERS ON THE DIFFERENCE BETWEEN
SUS AND THE CURRENT 1FA MODEL. RANK
ORDER THE INPUT PARAMETERS.

450
SELECT INPUT PARAMETER WITH THE HIGHEST
RANK AMONG CANDIDATE PARAMETERS AS
CURRENT DOMINANT INPUT PARAMETER

460
GENERATE POLYNOMIAL FOR THE CURRENT
DOMINANT INPUT PARAMETER

470
UPDATE 1FA MODEL AND CANDIDATE
PARAMETER LIST

GOOD FIT?
480

NO

ALL
PARAMETERS
PROCESSED?
485

NO

YES

YES

490
SET CSCMM TO LATEST 1FA
MODEL AND EXIT

FIG. 4A

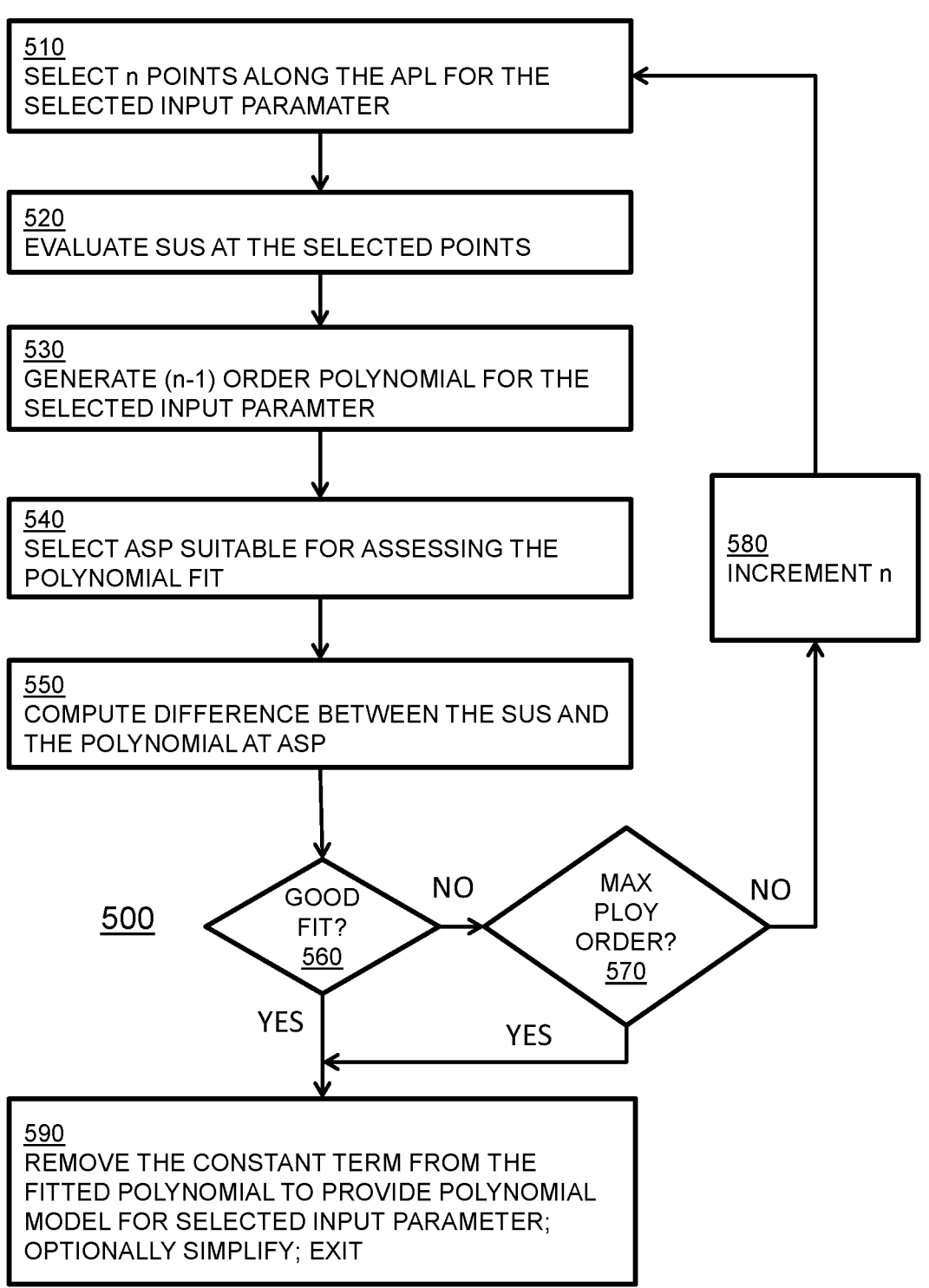

510
SELECT n POINTS ALONG THE APL FOR THE SELECTED INPUT PARAMATER

520
EVALUATE SUS AT THE SELECTED POINTS

530
GENERATE (n-1) ORDER POLYNOMIAL FOR THE SELECTED INPUT PARAMTER

540
SELECT ASP SUITABLE FOR ASSESSING THE POLYNOMIAL FIT

550
COMPUTE DIFFERENCE BETWEEN THE SUS AND THE POLYNOMIAL AT ASP

580
INCREMENT n

500

GOOD FIT? 560

NO

MAX PLOY ORDER? 570

NO

YES

YES

590
REMOVE THE CONSTANT TERM FROM THE FITTED POLYNOMIAL TO PROVIDE POLYNOMIAL MODEL FOR SELECTED INPUT PARAMETER; OPTIONALLY SIMPLIFY; EXIT

FIG. 5

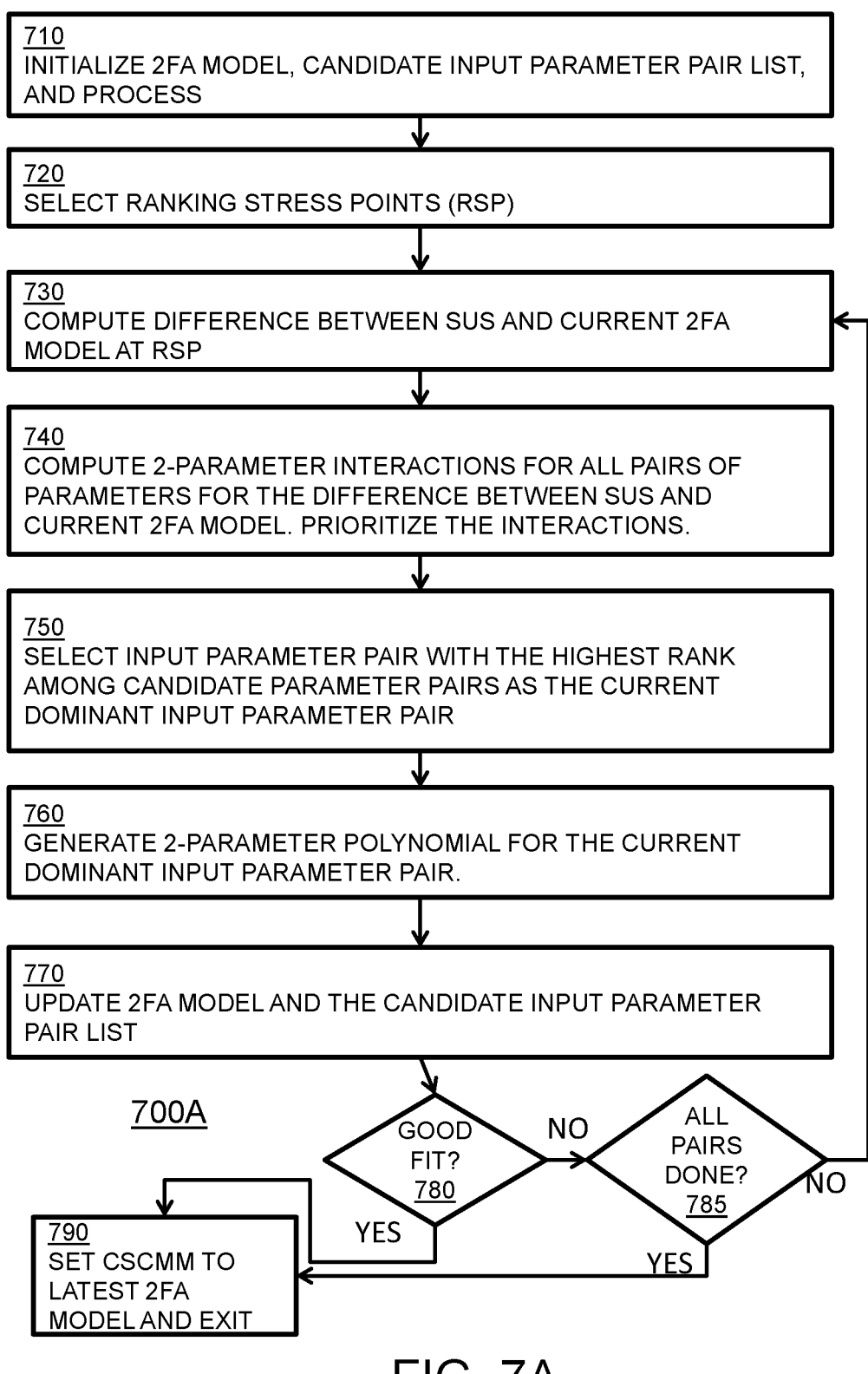

710
INITIALIZE 2FA MODEL, CANDIDATE INPUT PARAMETER PAIR LIST, AND PROCESS

720
SELECT RANKING STRESS POINTS (RSP)

730
COMPUTE DIFFERENCE BETWEEN SUS AND CURRENT 2FA MODEL AT RSP

740
COMPUTE 2-PARAMETER INTERACTIONS FOR ALL PAIRS OF PARAMETERS FOR THE DIFFERENCE BETWEEN SUS AND CURRENT 2FA MODEL. PRIORITIZE THE INTERACTIONS.

750
SELECT INPUT PARAMETER PAIR WITH THE HIGHEST RANK AMONG CANDIDATE PARAMETER PAIRS AS THE CURRENT DOMINANT INPUT PARAMETER PAIR

760
GENERATE 2-PARAMETER POLYNOMIAL FOR THE CURRENT DOMINANT INPUT PARAMETER PAIR.

770
UPDATE 2FA MODEL AND THE CANDIDATE INPUT PARAMETER PAIR LIST

700A

GOOD FIT? 780          NO          ALL PAIRS DONE? 785          NO

YES                                    YES

790
SET CSCMM TO LATEST 2FA MODEL AND EXIT

FIG. 7A

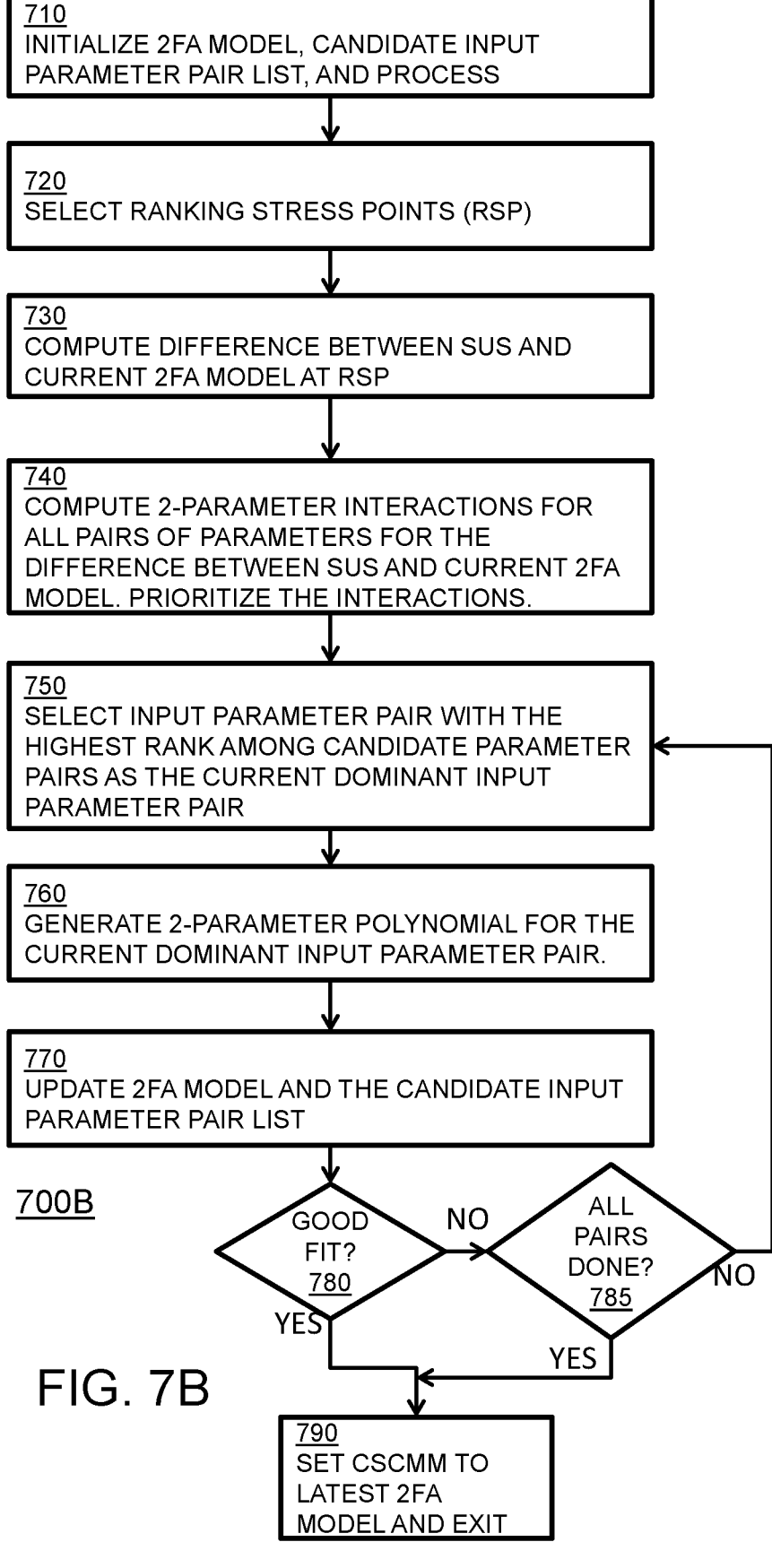

710
INITIALIZE 2FA MODEL, CANDIDATE INPUT PARAMETER PAIR LIST, AND PROCESS

720
SELECT RANKING STRESS POINTS (RSP)

730
COMPUTE DIFFERENCE BETWEEN SUS AND CURRENT 2FA MODEL AT RSP

740
COMPUTE 2-PARAMETER INTERACTIONS FOR ALL PAIRS OF PARAMETERS FOR THE DIFFERENCE BETWEEN SUS AND CURRENT 2FA MODEL. PRIORITIZE THE INTERACTIONS.

750
SELECT INPUT PARAMETER PAIR WITH THE HIGHEST RANK AMONG CANDIDATE PARAMETER PAIRS AS THE CURRENT DOMINANT INPUT PARAMETER PAIR

760
GENERATE 2-PARAMETER POLYNOMIAL FOR THE CURRENT DOMINANT INPUT PARAMETER PAIR.

770
UPDATE 2FA MODEL AND THE CANDIDATE INPUT PARAMETER PAIR LIST

700B

GOOD FIT? 780          NO          ALL PAIRS DONE? 785

YES          NO

YES

790
SET CSCMM TO LATEST 2FA MODEL AND EXIT

Figure 11:
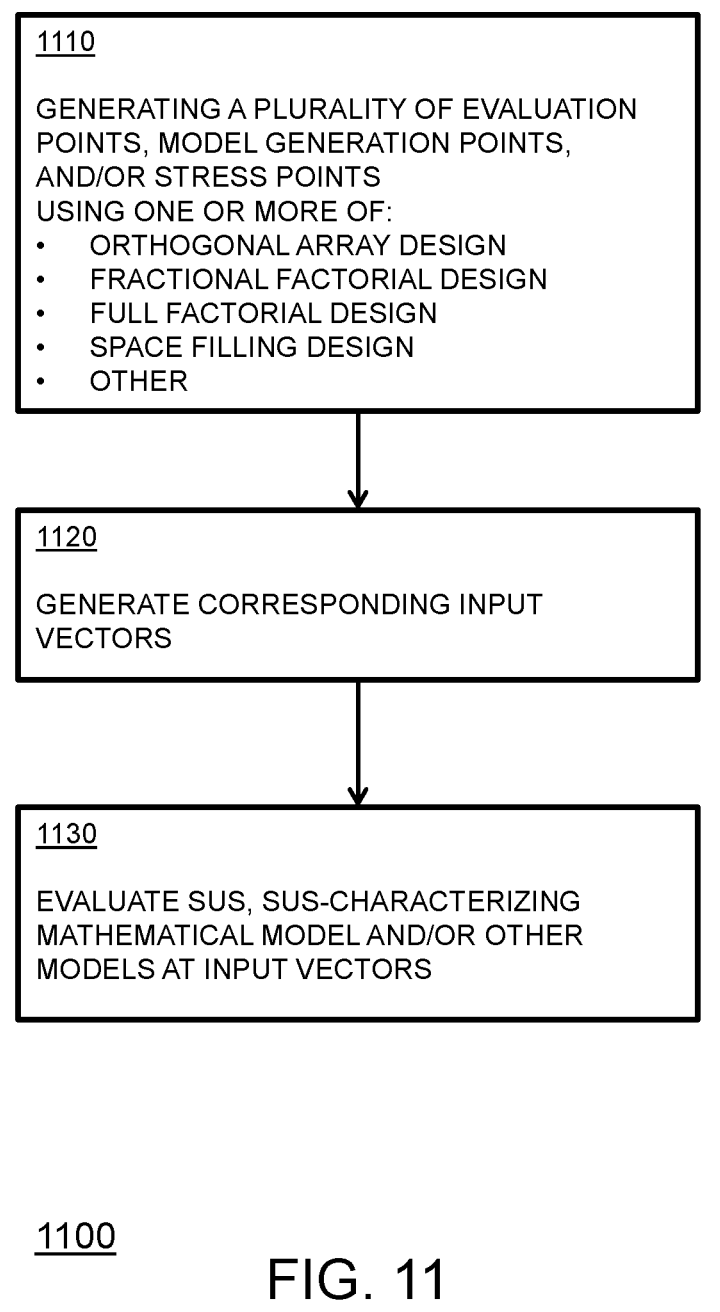

GENERATING A PLURALITY OF EVALUATION
POINTS, MODEL GENERATION POINTS,
AND/OR STRESS POINTS
USING ONE OR MORE OF:
- ORTHOGONAL ARRAY DESIGN
- FRACTIONAL FACTORIAL DESIGN
- FULL FACTORIAL DESIGN
- SPACE FILLING DESIGN
- OTHER

1120

GENERATE CORRESPONDING INPUT
VECTORS

1130

EVALUATE SUS, SUS-CHARACTERIZING
MATHEMATICAL MODEL AND/OR OTHER
MODELS AT INPUT VECTORS

Figure 12:
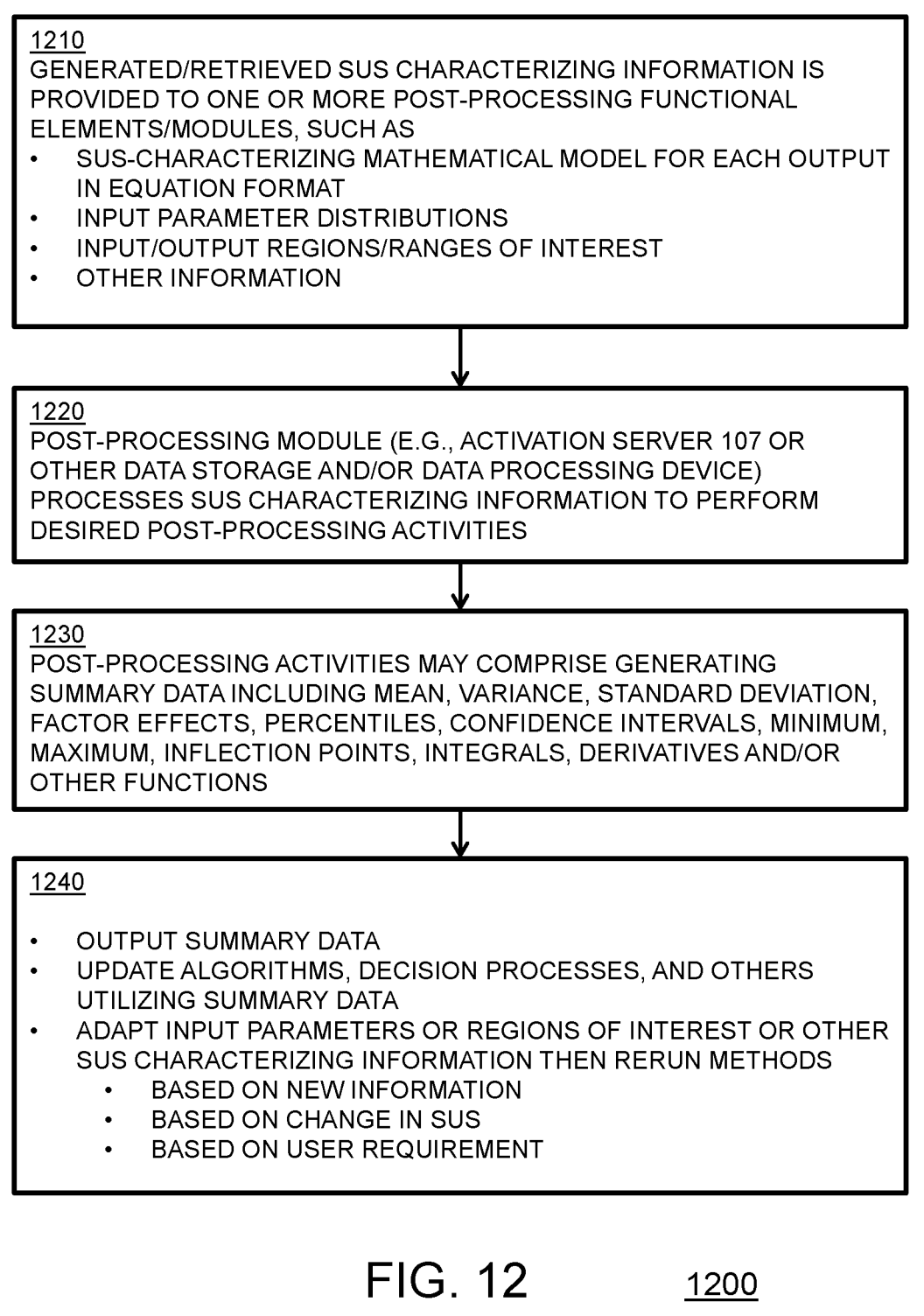

1210
GENERATED/RETRIEVED SUS CHARACTERIZING INFORMATION IS
PROVIDED TO ONE OR MORE POST-PROCESSING FUNCTIONAL
ELEMENTS/MODULES, SUCH AS
- SUS-CHARACTERIZING MATHEMATICAL MODEL FOR EACH OUTPUT
  IN EQUATION FORMAT
- INPUT PARAMETER DISTRIBUTIONS
- INPUT/OUTPUT REGIONS/RANGES OF INTEREST
- OTHER INFORMATION

1220
POST-PROCESSING MODULE (E.G., ACTIVATION SERVER 107 OR
OTHER DATA STORAGE AND/OR DATA PROCESSING DEVICE)
PROCESSES SUS CHARACTERIZING INFORMATION TO PERFORM
DESIRED POST-PROCESSING ACTIVITIES

1230
POST-PROCESSING ACTIVITIES MAY COMPRISE GENERATING
SUMMARY DATA INCLUDING MEAN, VARIANCE, STANDARD DEVIATION,
FACTOR EFFECTS, PERCENTILES, CONFIDENCE INTERVALS, MINIMUM,
MAXIMUM, INFLECTION POINTS, INTEGRALS, DERIVATIVES AND/OR
OTHER FUNCTIONS

1240

- OUTPUT SUMMARY DATA
- UPDATE ALGORITHMS, DECISION PROCESSES, AND OTHERS
  UTILIZING SUMMARY DATA
- ADAPT INPUT PARAMETERS OR REGIONS OF INTEREST OR OTHER
  SUS CHARACTERIZING INFORMATION THEN RERUN METHODS
  - BASED ON NEW INFORMATION
  - BASED ON CHANGE IN SUS
  - BASED ON USER REQUIREMENT

FIG. 12          1200

METHOD AND APPARATUS FOR RAPID APPROXIMATION OF SYSTEM MODEL

CROSS-REFERENCE TO RELATED APPLICATIONS

This application is a continuation of pending U.S. patent application Ser. No. 14/192,291, filed on Feb. 27, 2014, entitled METHOD AND APPARATUS FOR RAPID APPROXIMATION OF SYSTEM MODEL.

FIELD OF THE INVENTION

The invention relates generally to mechanisms for rapidly generating a mathematical model to closely approximate a system under study (SUS).

BACKGROUND

Traditional approaches to calculate a summary statistic (mean, variance, etc.) is to generate a large number of random input vectors (i.e., sets of input parameters) and evaluate the corresponding output vectors (i.e., sets of output parameters) by conducting tests on the System Under Study SUS. This is commonly known as Monte Carlo simulation or Monte Carlo experimentation. The term SUS is used in a relatively broad manner to refer to a mechanical system, electrical system, chemical system, biological system, electromechanical system, software system, financial system and so on. Mean, probability of occurrence of certain events, variance, and other summary statistics of the output vectors are typically computed.

Traditional system modeling and simulation methods are extremely costly in terms of computational, memory, input/output and other resources, hardware experimental cost, in terms of time and so on due to large numbers of input and operational variables, many interdependencies between the variables and so on.

A system may comprise an article of manufacture having a plurality of assemblies, where each of the assemblies comprises a plurality of components. For example, complex models and simulations for safety systems such as airbags, seat belts and the like are created to ensure that these critical systems will perform their intended functions under various operating conditions. This modeling and simulation of safety systems (or other systems) is performed prior to production of such systems or integration of such systems into a product. Key variables that contribute to uncertainty include passenger weight (e.g., 120-200 lbs), passenger height (e.g., 56-80 inches), lower seat position (e.g., 14-28 inches), recline angle (e.g., 0-27 degrees), manufacturing variability (e.g., change in a critical dimension by +/−0.002 inches) and so on.

A system may comprise a service associated with a plurality of sub services and/or service components. For example, in a financial model to evaluate foreign corporate bond investment, there are multiple parameters that can vary and create uncertainty in terms of decision-making. Key uncertainty variables might include local borrowing rate, local market yield for similar bonds, foreign exchange rates, local tax rate, foreign tax rate and so on. The financial model itself may be included within a larger risk model associated with an entity owning a plurality of investments including foreign corporate bonds. A modeling and simulation of the financial model must be performed prior to investment.

SUMMARY

Various embodiments provide systems, methods, apparatus and/or mechanisms that iteratively generate one or more equations (conforming to one or more functions or function types) of increasing complexity (e.g., degree or order) to provide one or more corresponding approximations of a physical System Under Study (SUS), where each approximation or "fit" provides additional information about the SUS, where the various equations may be summed to provide a final "fit" having an adequate level of accuracy. Models defined according to polynomials, orthogonal polynomials and/or other functions may be iteratively improved using deterministic data/techniques in which only those variables and model terms determined at each iteration to be dominant contributors to model accuracy are further processed. Analytical integration techniques may be used to estimate mean, variance and other summary statistics. In this manner, the various costs associated with processing non-dominant contributors are avoided while achieving a sufficiently high level of accuracy.

In one embodiment, an apparatus is provided for modeling a physical System Under Study (SUS), the SUS exhibiting at least one physical output adapted in response to a plurality of physical input parameters, the apparatus comprising a processor configured to: generate an improved approximation model for said SUS comprising a summation of an initial approximation model, a constant term, and a plurality of polynomials, each polynomial being associated with a respective N-tuplet of input parameters for greater than zero integer values of N, wherein polynomials included within said improved approximation model are generated by iteratively performing the following steps until a sufficiently accurate fit is achieved: (1) rank ordering the N-tuplets of input parameters; (2) selecting a highest ranking N-tuplet of input parameters from among the remaining N-tuplets of input parameters to be processed; (3) fitting a polynomial involving input parameters in the selected N-tuplet of input parameters; (4) updating the current approximation model by adding the fitted polynomial; (5) adjusting the constant term as needed to match the evaluations of the SUS and the current approximation model at a point; and (6) evaluating a difference between the SUS and the current approximation model to determine if a sufficiently accurate fit is achieved.

BRIEF DESCRIPTION OF THE DRAWINGS

The teachings herein can be readily understood by considering the following detailed description in conjunction with the accompanying drawings, in which:

FIG. 2 depicts a flow diagram of a method according to various embodiments;

FIGS. 3A-3E depict flow diagrams of various SUS model fitting methods;

FIGS. 4A-4B depict flow diagrams of a method of fitting a first fit approximation model (1FA) to a SUS according to various embodiments;

FIG. 5 depicts a flow diagram of a method of generating a first fit polynomial model for a selected input parameter associated with a SUS;

FIGS. 7A-7B depict a flow diagrams of a method of generating a second fit approximation model (2FA) involving pairs of input parameters associated with a SUS;

FIG. 11 graphically depicts a flow diagram of a method of generating stress points, generating corresponding input vectors, and evaluating a SUS and/or SUS-characterizing mathematical model according to one embodiment;

FIG. 12 describes method of post-processing SUS-characterizing information according to one embodiment.

To facilitate understanding, identical reference numerals have been used, where possible, to designate identical elements that are common to the figures.

DETAILED DESCRIPTION OF THE INVENTION

Figure 1:
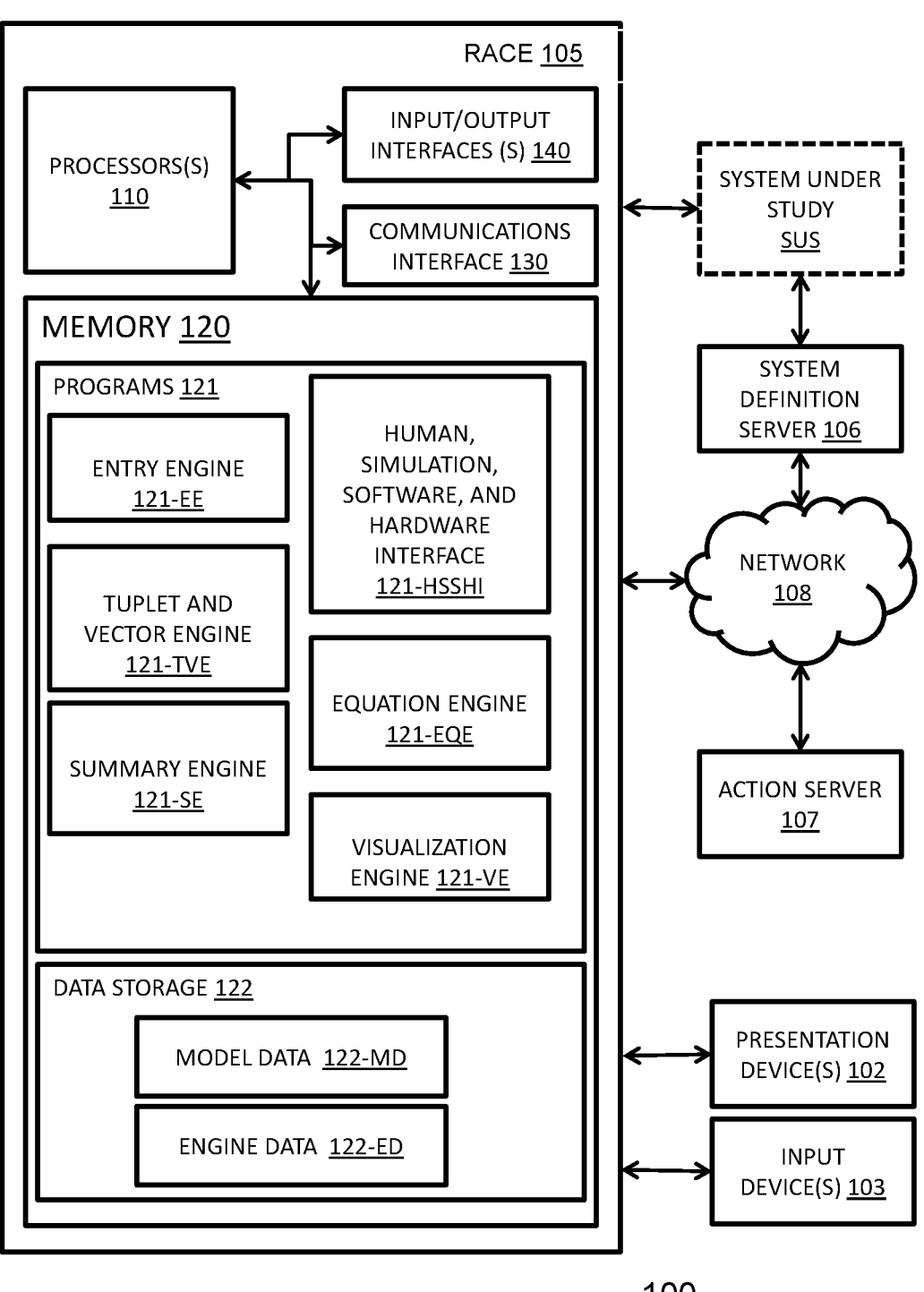
FIG. 1 depicts a high-level block diagram of a system suitable for use in implementing the various embodiments.

Systems, methods, apparatus, mechanisms and the like for efficiently modeling a System Under Study (SUS) or component(s) thereof are depicted and described herein. Generally speaking, the various embodiments described herein implement a Rapid Accurate Estimator Machine (RACE) adapted to efficiently develop and validate a mathematical model closely approximating a behavior of a System Under Study (SUS) within specified region of interest. The RACE is also adapted to efficiently and accurately determine mean, variance, probability of occurrence of an event, and other summary statistics associated with various outputs and functions of outputs of the SUS for given probability distributions of the SUS input parameters.

In various embodiments, the SUS is presented by a user or SUS-source or SUS-characterizer in the form of a computer simulation, a software system, a physical system, a chemical system, a biological system, a financial system or any other simple/complex system (or combination thereof) adapted to receive input data such as test vectors which, when processed by the SUS, provide output data or results that may be computed or observed.

Various embodiments develop a mathematical model to closely approximate the behavior of a SUS within a specified region of interest. Developing accurate mathematical models to represent SUS is a well-known challenge and can require significant test or simulation resources. In addition to summary statistics computation, the invention provides a systematic process for developing and validating a mathematical model.

Generally speaking, the various embodiments provide a mechanism for generating an accurate model of a System Under Study (SUS) in a highly efficient manner to avoid executing the thousands or millions of random/systematic simulations typically necessary to generate an accurate SUS model and/or its summary statistics.

The various embodiments enable rapid decision making by those taking action in response to the SUS behavior or performance. In this manner, time critical applications such as high-speed trading may be improved with significantly less computing resources or without any significant increase in applied computing resources.

Various embodiments of this invention utilize polynomials (e.g. orthogonal polynomials) or other classes of functions (e.g. Fourier series, wavelets, Walsh functions) which are iteratively fit to SUS evaluations. In the various embodiments, polynomials are fit successively starting with single parameter terms and progressing to, when applicable, multiple input parameter terms. In various embodiments, input parameters and interactions of multiple input parameters to be fit are prioritized based on structured test vectors (e.g. based on orthogonal arrays) executed on the SUS.

Various embodiments allow for optimization of polynomial fits to only include dominant contributing polynomial terms in the SUS-characterizing mathematical model (SCMM) to improve processing performance while maintaining acceptable accuracy. In various embodiments, the iterative mathematical model building process is optimized to stop adding new terms when accuracy requirements are attained. Various embodiments of this invention prescribe use of structured test vectors (e.g. based on orthogonal arrays) for assessing "goodness" of fit of a SUS-characterizing mathematical model versus actual SUS evaluations using goodness of fit metrics (e.g. a maximum absolute difference, a sum of absolute differences, a mean square of the difference and/or a mean square of the selected top absolute differences, a mean square error, other criteria, etc.).

The SUS may comprise any system, such as a system with at least one output (including one or more outputs or characteristics of interest to a user or other entity) adapted in response to a plurality of inputs. Generally speaking, the various methods iteratively generate one or more equations (conforming to one or more functions or function types) of increasing complexity (e.g., degree or order) to provide one or more corresponding approximations of the SUS, where each approximation or "fit" provides additional information about the SUS, wherein the various equations may be summed to provide a final "fit" having an adequate level of accuracy.

Various embodiments of this invention utilize analytical and numerical integration techniques to compute summary statistics (e.g. mean, variance, etc.) from the generated SUS-characterizing mathematical model SCMM.

FIG. 1 depicts a high-level block diagram of a system suitable for use in implementing the various embodiments. The system 100 of FIG. 1 comprises one or more data processing elements, computing devices, network elements and the like cooperating as described herein to implement various embodiments. Not all of the described data processing elements, computing devices, network elements and the like are necessary to implement each embodiment. The exemplary system 100 described herein is provided for illustrative purposes only.

The system 100 of FIG. 1 contemplates a server, workstation or other computing device implementing a Rapid Accurate Estimator Machine (RACE) 105 operating in accordance to the various embodiments, such as described herein and with respect to the various other figures.

In various embodiments, the RACE 105 operates with process descriptors and/or other information associated with a System Under Study (SUS) or portion thereof to generate a sufficiently accurate model of the SUS or portion thereof such that operation of the SUS may be visualized, explored and otherwise understood. An SUS descriptor generally comprises descriptive information associated with the SUS suitable for use in modeling SUS behavior, confirming results of SUS behavior models and the like. The SUS descriptor may be of any format suitable for processing by the RACE 105.

A sufficiently accurate fit of a model or component thereof occurs when, illustratively, an evaluation of the model or component thereof and the relevant SUS (or component thereof) or other SUS portions at stress points results in a difference below a threshold level. The difference threshold level may be defined as a number of relevant units (e.g., 1, 10 etc.), a percentage of accuracy (e.g., 80%, 99.99% etc.) a number of standard deviations (e.g., 3SD, 6SD etc.) or some other representation and/or units appropriate to the particular SUS. Generally speaking, any technique for defining "good fit" may be used within the context of the various embodiments.

In various embodiments, the generated model is used to drive further actions, such as computation of mean and standard deviation, as SUS operational dynamics and the like become more accurately characterized by the RACE 105.

In various embodiments, the system 100 may further include one or both of a system definition server 106 and an action server 107, either of which may be in communication with the RACE 105 and/or each other via a direct communication link or via a network 108. The system definition server 106 and action server 107 may be implemented together or separately, in a single computing device or via multiple computing devices. In various embodiments, a single server, workstation or other computing device is adapted to implement the various functions associated with the RACE 105, system definition server 106 and action server 107.

The optional system definition server 106 may comprise a standard server or other computing device adapted to provide to the RACE 105 SUS descriptors and/or other information suitable for characterizing input/output functions, transfer functions, exceptions and/or other characterizing information associated with a SUS. This information may be provided to the RACE 105 according to any suitable format.

The optional action server 107 receives SUS model data, SUS visualization data and other data from the RACE 105 to perform various actions in response thereto. Such actions may include automated processes such as automated stock trading, automated failure analysis, automated production or assembly adjustments and so on. Generally speaking, the action server 107 operates to take action in response to one or more SUS models generated by the RACE 105, and/or different types of data derived by the RACE 105 during and/or after the generation of such one or more SUS models. In various embodiments, the action server 107 may also receive and use SUS descriptors or other SUS-representative information provided by, illustratively, the optional the system definition server 106.

As shown in FIG. 1, the RACE 105 is configured in a particular manner in terms of hardware, software, input/output resources, connected devices/functions and the like. However, it will be appreciated by those skilled in the art that the RACE 105 may be configured according to any one of a number of computing topologies or configurations. That is, the RACE 105 may comprise a general purpose computer, a special purpose computer, a specific type of server and/or any other computing device capable of performing the various functions described herein. Thus, the RACE 105 as described herein with respect to FIG. 1 may also be implemented as a general purpose computing device, such as described in more detail below with respect to FIG. 13.

As depicted in FIG. 1, the RACE 105 includes one or more processors 110, a memory 120, communications interfaces 130 and an input-output (I/O) interface 140. The processor 110 is coupled to each of memory 120, communication interfaces 130, and I/O interface 140.

The processor 110 is configured for controlling the operation of RACE 105, including operations supporting the methodologies described herein with respect to the various figures, any interactions with the system definition server 106, action server 107, network 108 or other devices/systems.

The memory 120 is configured for storing information suitable for use in generating a sufficiently accurate model of a System Under Study (SUS) according to the various embodiments. Specifically, memory 120 may store programs 121, data 122 and so on. Within the context of the various embodiments, the programs 121 and data 122 may vary depending upon the specific functions implemented by the RACE 105. For example, as depicted in FIG. 1, the programs portion 121 of memory 120 includes functional modules denoted as follows: an Entry Engine 121-EE, a Tuplet and Vector Engine 121-TVE, a Human Simulation Software and Hardware Interface 121-HSSHI, an Equation Engine 121-EQE, a Summary Engine 121-SE and a Visualization Engine 121-VE. Similarly, the data storage portion 122 of memory 120 is depicted as including model data 122-MD and engine data 122-ED. The functional blocks 121-EE, 121-TVE, 121-SE, 121-HSSHI, 121-EQE, and 121-VE may also be referred as EE, TVE, SE, HSSHI, EQE, and VE, respectively.

The Entry Engine EE provides a mechanism to receive and store User and/or System inputs associated with the RACE methodologies, such as information received from a User, a System definition server 106, a SUS or some other source.

The Tuplet Vector Engine TVE provides a mechanism to generate input vectors used for evaluating the SUS, which could be present in the form of hardware, simulation software, or some other mechanism. The TVE may also be used for evaluation of SUS-characterizing mathematical models.

The Summary Engine SE provides a mechanism for computing summary statistics such as mean, variance and the like such as derived from the SUS-characterizing mathematical model.

The Human Simulation Software and Hardware Interface HSSHI provides a mechanism for transmitting input parameter data to SUS, receiving output data from SUS and generally interacting with human operators, computer simulations, hardware in loop systems, embedded software systems, and other interfaces to execute and collect data from the SUS and/or SUS-characterizing mathematical model.

The Equation Engine EQE provides a mechanism for processing SUS evaluations data to generate, refine or otherwise update the SUS-characterizing mathematical model to iteratively improve accuracy such that the SUS-characterizing mathematical model more closely approximates actual behavior of the SUS. It also provides a mechanism for assessing "goodness" (i.e., sufficiency) of fit of the SUS-characterizing mathematical model.

The Visualization Engine VE provides a mechanism for processing SUS evaluations and SUS-characterizing mathematical model evaluations to provide output information, such as for User and/or System consumption in an appropriate format, such as via databases, metadata, tables, graphs, charts, and other data storage or data visualization techniques.

Generally speaking, the memory 120 may store any information suitable for use by the RACE 105 in implementing one or more of the various methodologies or mechanisms described herein. It will be noted that while various functions are associated with specific programs or databases, there is no requirement that such functions be associated in the specific manner. Thus, any implementations achieving the functions of the various embodiments may be used.

The communications interfaces 130 may include one or more services signaling interfaces such as a Wi-Fi or WiMAX interface, a 3G wireless interface, a 4G wireless interface, an Ethernet interface and the like for supporting data/services signaling between RACE 105 and the network 108. It will be appreciated that fewer or more, as well as different, communications interfaces may be supported. The various communications interfaces 130 are adapted to facilitate the transfer of files, data structures, messages, requests and the like between various entities in accordance with the embodiments discussed herein.

The I/O interface 140 may be coupled to one or more presentation devices (PDs) 102 such as associated with display devices for presenting information to a user, one or more input devices (IDs) 103 such as touch screen or keypad input devices for enabling user input, and/or interfaces enabling communication between the RACE 105 and other computing, networking, presentation or input/output devices (not shown).

Presentation devices 102 may include a display screen, a projector, a printer, one or more speakers, and the like, which may be used for displaying data, displaying video, playing audio, and the like, as well as various combinations thereof. The typical presentation interfaces associated with user devices, including the design and operation of such interfaces, will be understood by one skilled in the art.

Input devices (ID) 103 may include any user control devices suitable for use in enabling a local or remote user of the RACE 105 to interact with the RACE 105. For example, the input devices 103 may include touch screen based user controls, stylus-based user controls, a keyboard and/or mouse, voice-based user controls, and the like, as well as various combinations thereof. The typical user control interfaces of user devices, including the design and operation of such interfaces, will be understood by one skilled in the art.

Although primarily depicted and described as having specific types and arrangements of components, it will be appreciated that any other suitable types and/or arrangements of components may be used for RACE 105.

It will be appreciated that the functions depicted and described herein may be implemented in software and/or hardware, e.g., using a general purpose computer, one or more application specific integrated circuits (ASIC), and/or any other hardware equivalents. In one embodiment, the various programs depicted as loaded within memory 120 are executed by the processor(s) 110 to implement their respective functions. It will also be appreciated that the various programs may be stored on a computer readable storage medium prior to being loaded into memory 120; such computer readable storage media comprising semiconductor memory devices, magnetic media, optical media, electromagnetic media and the like. Generally speaking, any form of tangible computer memory may be used to store computer instructions which, when executed by the processor 110, operate to perform the various methods and functions described herein.

It is contemplated that some of the steps discussed herein as software methods may be implemented within hardware, for example, as circuitry that cooperates with the processor to perform various method steps. Portions of the functions/elements described herein may be implemented as a computer program product wherein computer instructions, when processed by a computer, adapt the operation of the computer such that the methods and/or techniques described herein are invoked or otherwise provided. Instructions for invoking the inventive methods may be stored in tangible fixed or removable media, transmitted via a data stream in a broadcast or other tangible signal-bearing medium, and/or stored within a memory within a computing device operating according to the instructions.

FIG. 2 depicts a flow diagram of a method according to various embodiments. Specifically, the method 200 of FIG. 2 depicts several high-level processing steps performed by an apparatus operative to iteratively improve a SUS-characterizing mathematical model SCMM to a sufficient level of accuracy, such as the RACE 105 described above with respect to FIG. 1. Various steps described herein with respect to FIG. 2 will be described in more detail below with respect to further figures.

At step 210, the method 200 receives input information from user, software module, interface and/or system input means. For example, the input information may be received via the Entry Engine 121-EE associated with the RACE 105. The input information may comprise, illustratively, information such as definitions of SUS input parameters and output parameters, SUS input/output parameter distributions or ranges of interest if applicable, joint distributions of input parameters if applicable, SUS type, any interface requirements and/or other information pertaining to the SUS or entities in communication with the RACE 105.

The term "User" as described herein may comprise a human operator at a workstation or other computing device, a computing machine, software executed upon a computing machine, an external system configured to provide inputs to and process outputs from the RACE 105 and/or SUS and so on.

The term "System" as described herein may comprise any internal or default operations, metadata, configuration files or settings configured to provide inputs to and process outputs from the RACE 105 and/or SUS and so on.

Input parameter distribution, if applicable, can be provided as Gaussian, Log Normal, uniform, triangular, and/or other distribution function.

The term "input parameters" may also be referred to herein as "factors" or "input factors" while the term "output parameters" may also be referred to herein as "outputs" or "responses" such as in accordance with the appropriate terminology associated with a particular SUS or SUS-characterizing mathematical model SCMM. For example, in a financial modeling SUS, input parameters may comprise an interest rate, an exchange rate, a volatility indicator and the like. Further, the User may supply a mean and variance for the input parameters.

The term "region of interest" RI of an input parameter as described herein may be defined as a nominal operating range of values, a highest impact range of values, and/or a selected range of values. In various embodiments, the region of interest RI is the region spanned by the mean plus/minus a certain multiple of the standard deviation for the input parameter (e.g., 2, 3 or other multiple). In various embodiments, a region of interest for an input parameter may be defined with respect to a specified percent of probability (80%, 90% or other). If a range of interest (e.g., upper and lower bound) of an input parameter is specified, then the range of interest may also be used to define a region of interest associated with that input parameter. The term "dimensional limit" DL as described herein is defined as the number of input parameters specified by the User or System (e.g., where a User and/or System has specified 10 input parameters, the DL is 10).

In various embodiments, the region of interest RI for the collection of input parameters is the multidimensional region spanned by the region of interest for all input parameters. A Center Point CP is a point in the DL dimensional RI of the input parameter space. In some embodiments the Center Point CP coincides with the centroid of the DL dimensional RI of the input parameter space. In another embodiment, the CP would be located at the modes of the probability distributions of the input parameters. In some embodiments, the CP would be located at the mean of the probability distributions of the input parameters, or other. In some embodiments, CP is a point specified by the User, System or default as a suitable point in RI.

At step 220, the method 200 generates a simplified model to provide a good fit (close approximation) of the SUS in the RI using a systematic algorithmic process. Specifically, SUS information as well as various Constraints may be used within the context of approximating the SUS by generating a SUS-characterizing mathematical model SCMM to closely approximate the SUS in a specific region of interest. For example, the Equation Engine 121-EQE associated with the RACE 105 may be used for this purpose.

Generally speaking, at step 220 various processing steps are performed to generate and iteratively improve a SUS-characterizing mathematical model SCMM until a sufficient degree of model accuracy is attained with respect to one or more response variables of interest (e.g., risk level, output voltage of a circuit, stress in a component, failure rate, quality level, responsiveness, cost of materials, cost of ownership and so on). User or System specified Constraints may include accuracy specifications, goodness of fit criteria, financial limitations, resource limitations, mode of operation, loop back criteria, polynomial orders for various passes, and other. Constraints may be specified through the EE. Mode of operation may include specifications such as processor percentage utilization, resource consumption rates, settings to increase output speed, and other parameters. The various functions associated with step 220 will be described in more detail below with respect to FIGS. 3A-3E. The finalized model from step 220 is also referred to as a final fit SUS-characterizing mathematical model SCMM. The working model, before it is finalized is also referred to as a Current SUS-characterizing mathematical model CSCMM. The CSCMM may also be referred as a current approximation model.

At step 230, the method 200 computes summary statistics, accuracy estimates and savings ratio associated with a final fit SUS-characterizing mathematical model, such as mean, variance, accuracy estimates, savings ratios, parameter effects, computable statistics, and other information. For example, the Summary Engine 121-SE associated with the RACE 105 may be used for this purpose.

Generally speaking, at step 230 the method 200 stores/provides a finalized SCMM, computes summary statistics, transmits any process update messages or alarms, computes effects of input parameters or other parameters, computes interaction effects of input parameters or other parameters, computes savings ratio and/or performs other post processing computation or function as appropriate.

The model for closely approximating the SUS in the RI is finalized when goodness of fit is within User, System, and/or default specifications, DL limits are met, and/or Constraints restrict further improving of the model.

Summary statistics may include mean, standard deviation, variance, confidence intervals, and others. At step 230, given the equation for the SUS-characterizing mathematical model, these statistics are computed by using formulae for moments of the input parameter distributions, analytical integration, or through numerical integration or other methods. Correlations, if any, among input parameters may be characterized by the joint distribution of the input parameters, which is utilized in some embodiments to compute mean, standard deviation, variance, confidence intervals, and the like.

Computations may include input parameter effects and effects of interactions among the input parameters for each output parameter. If there are multiple output parameters, there would be an equation for each output parameter and the process is same for each output parameter. Additionally, in the case of multiple output parameters, SE may compute correlations among the output parameters in addition to other statistics. Provided an equation as developed using the processes described herein, input parameter effects, input parameter interactions for single and multiple outputs and correlations of output parameters may be calculated using standard statistical processes.

The savings ratio SR is a ratio of the number of evaluations using the RACE 105 versus the number of Monte Carlo evaluations required to get similarly accurate mean and variance calculations. In the case of multiple outputs, savings ratio SR may be computed for each output parameter.

At step 240, the various results of the prior steps are displayed and/or stored in a suitable manner for later use by a User, System and the like. For example, the Visualization Engine 121-VE associated with the RACE 105 may be used for this purpose. Generally speaking, at step 240 the method 200 stores/provides summary statistics in formats for User and System consumption, displays summary statistics and parameter effects in graphical formats, displays results via graphics or other presentation information and/or performs or provides other visualization information as appropriate and/or other post-processing.

For example, the VE may store the summary statistics, parameter effects, and other computations from step 230 in formats for consumption by User and/or System. These formats include tables, graphs, databases, and other formats specifically configured for the specific User or System. If User or System specified multiple output parameters, VE stores data for consumption for each output parameter.

The VE may display the summary statistics, parameter effects, and other computations from the various embodiments described herein. Relevant graphical formats may include bell curves, probability distributions, input parameter effects graphs, tables, scatter diagrams, histograms, response surface graphs, interaction effects, and other formats. If User or System specified multiple output parameters, VE displays the results for each output and combinations thereof.

FIGS. 3A-3E depict flow diagrams of various SUS model fitting methods suitable for use in, illustratively, implementing step 220 of the method 200 of FIG. 2.

Figure 3A:
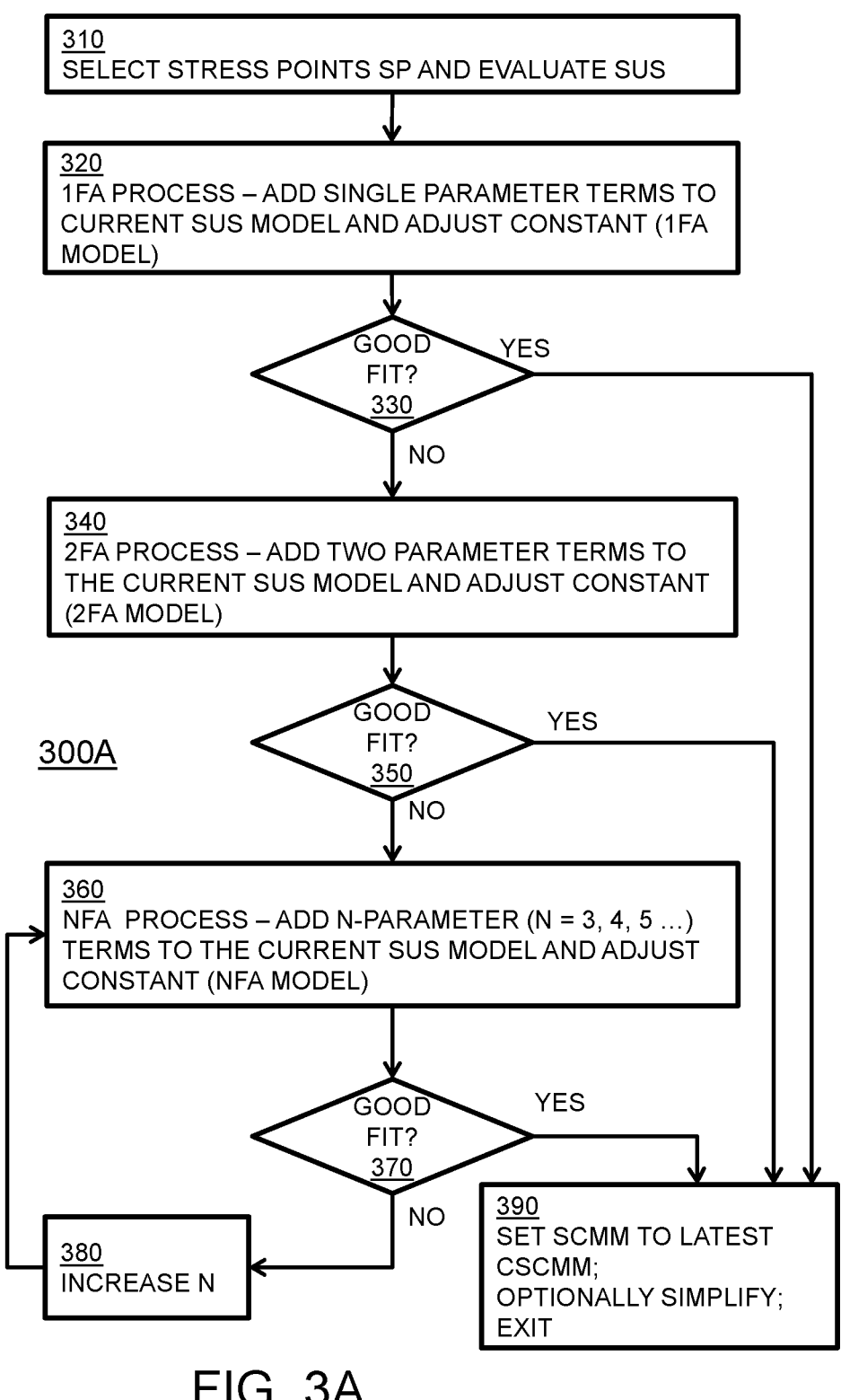

FIG. 3A depicts a method 300A according to one embodiment for implementing step 220 of the method 200 of FIG. 2.

At step 310, the method 300A (e.g., via the TVE) generates vectors comprising input parameters within a region of interest RI, representing a plurality of stress points SP in the region of interest RI, and evaluates the SUS at the selected stress points SP. An exemplary method of generating vectors, selecting stress points and evaluating the SUS at the selected stress points suitable for use in implementing step 310 will be described in more detail below with respect to FIG. 11.

Generally speaking, the SP may be generated to expose the inability of a model to adequately match the SUS output. In various embodiments, SP may be generated using an orthogonal array. In other embodiments, SP may be selected using fractional factorial designs, full factorial designs, design of experiments, space filling designs, and/or other methods. In various embodiments, SP selection may be dependent on User input, System input and/or specified Constraints. In various embodiments, the SUS is evaluated at the SP via, illustratively, the HSSHI.

As an example, in an embodiment having four input parameters (labeled u, v, w, and x) the process may select two levels or values for each of the input parameters. The levels would be labeled as $u_1$ and $u_2$ for parameter u, $v_1$ and $v_2$ for parameter v, and so on. It should be noted that the values $u_1$ and $u_2$ may be chosen within the RI for the parameter u; the values $v_1$ and $v_2$ may be chosen within the RI for the parameter v; and so on.

In operation, the various embodiments may select the orthogonal array L8 depicted below in Table 1 for generating stress points. The array has eight rows and seven columns. The method may, illustratively, select the first four columns to generate the stress points. The corresponding eight stress points SP are depicted in Table 2. The eight rows of this table represent the eight vectors for the eight stress points. Each vector has four components corresponding to the four columns labeled Parameter u, Parameter v, Parameter w, and Parameter x in Table 2.

TABLE 1

|   | Col1 | Col2 | Col3 | Col4 | Col5 | Col6 | Col7 |
|---|------|------|------|------|------|------|------|
| 1 | 1 | 1 | 1 | 1 | 1 | 1 | 1 |
| 2 | 1 | 1 | 1 | 2 | 2 | 2 | 2 |
| 3 | 1 | 2 | 2 | 1 | 1 | 2 | 2 |
| 4 | 1 | 2 | 2 | 2 | 2 | 1 | 1 |
| 5 | 2 | 1 | 2 | 1 | 2 | 1 | 2 |
| 6 | 2 | 1 | 2 | 2 | 1 | 2 | 1 |
| 7 | 2 | 2 | 1 | 1 | 2 | 2 | 1 |
| 8 | 2 | 2 | 1 | 2 | 1 | 1 | 2 |

TABLE 2

|   | Parameter u | Parameter v | Parameter w | Parameter x |
|---|------|------|------|------|
| 1 | $u_1$ | $v_1$ | $w_1$ | $x_1$ |
| 2 | $u_1$ | $v_1$ | $w_1$ | $x_2$ |
| 3 | $u_1$ | $v_2$ | $w_2$ | $x_1$ |
| 4 | $u_1$ | $v_2$ | $w_2$ | $x_2$ |
| 5 | $u_2$ | $v_1$ | $w_2$ | $x_1$ |
| 6 | $u_2$ | $v_1$ | $w_2$ | $x_2$ |
| 7 | $u_2$ | $v_2$ | $w_1$ | $x_1$ |
| 8 | $u_2$ | $v_2$ | $w_1$ | $x_2$ |

In another example, again with same four input parameters, the various embodiments may select a full factorial design consisting of all combinations of the two levels each for the four parameters. The corresponding 16 stress points are depicted below with respect to Table 3.

TABLE 3

|   | Parameter u | Parameter v | Parameter w | Parameter x |
|---|------|------|------|------|
| 1 | $u_1$ | $v_1$ | $w_1$ | $x_1$ |
| 2 | $u_1$ | $v_1$ | $w_1$ | $x_2$ |
| 3 | $u_1$ | $v_1$ | $w_2$ | $x_1$ |

TABLE 3-continued

|   | Parameter u | Parameter v | Parameter w | Parameter x |
|---|------|------|------|------|
| 4 | $u_1$ | $v_1$ | $w_2$ | $x_2$ |
| 5 | $u_1$ | $v_2$ | $w_1$ | $x_1$ |
| 6 | $u_1$ | $v_2$ | $w_1$ | $x_2$ |
| 7 | $u_1$ | $v_2$ | $w_2$ | $x_1$ |
| 8 | $u_1$ | $v_2$ | $w_2$ | $x_2$ |
| 9 | $u_2$ | $v_1$ | $w_1$ | $x_1$ |
| 10 | $u_2$ | $v_1$ | $w_1$ | $x_2$ |
| 11 | $u_2$ | $v_1$ | $w_2$ | $x_1$ |
| 12 | $u_2$ | $v_1$ | $w_2$ | $x_2$ |
| 13 | $u_2$ | $v_2$ | $w_1$ | $x_1$ |
| 14 | $u_2$ | $v_2$ | $w_1$ | $x_2$ |
| 15 | $u_2$ | $v_2$ | $w_2$ | $x_1$ |
| 16 | $u_2$ | $v_2$ | $w_2$ | $x_2$ |

At step 310, the method 300A (e.g., via the EQE) also initializes the current SUS-characterizing mathematical model CSCMM to zero or to an initial User or System provided approximation model, if any.

At step 320, the method 300A (e.g., via the EQE) improves the CSCMM (current SUS model) by adding single parameter terms and adjusting the constant. That is, the method 300A at step 320 generates a first fit approximation model for SUS, model comprising of the CSCMM and single parameter polynomials of adequate orders for input parameters associated with the SUS, so as to closely approximate the SUS in the RI. The resulting model, which comprises a sum of the CSCMM, single parameter polynomials, and a constant term, is referred to as the 1FA model. An exemplary method of fitting a 1FA model suitable for use in implementing step 320 will be described in more detail below with respect to FIGS. 4A-4B.

Within the context of a finance SUS example, the 1FA model may comprise, illustratively, a constant term, a polynomial for interest rate of appropriate order, a polynomial for the exchange rate of appropriate order, and a polynomial for each of the other input parameters of appropriate orders. Other modifications/models are also contemplated by the inventors.

At step 330, a determination is made as to whether the evaluation of the 1FA model at the SP indicates that the 1FA model represents a good fit to the SUS. If the 1FA model represents a good fit, CSCMM is set equal to the 1FA model and the method 300A exits at step 390. If the 1FA model does not represent a good fit, CSCMM is set equal to the 1FA model and the method 300A proceeds to step 340.

Generally speaking, differences between the 1FA model (or another SUS-characterizing mathematical model) and SUS evaluations at the corresponding stress points are assessed according to goodness of fit criteria such as a maximum absolute difference, a sum of absolute differences, a mean square of selected top absolute differences, a mean square error, or other. The goodness of fit criteria may be specified by User or System and could be a part of inputs supplied, default settings, or Constraints. If the difference between the SUS and the 1FA model (or other SUS-characterizing mathematical model) according to the goodness of fit criteria is outside User or System specification, then the fit is considered not a good fit, CSCMM is set equal to the 1FA model, and the CSCMM is broadened in scope to improve its accuracy by proceeding to step 340. If the difference is within the User or System specification, then the fit is considered a good fit, CSCMM is set equal to the 1FA model, and the method 300A exits at step 390.

At step 340, the method 300A (e.g., via the EQE) improves the CSCMM (current SUS model) by adding two parameter terms and adjusting the constant. That is, at step 340, 2-parameter terms of the type $x_1^m x_2^n$ are systematically added to the CSCMM to provide thereby a second fit approximation model, where m and n are positive integers greater than zero and $x_1$ and $x_2$ are input parameters. The resulting model, which comprises a sum of the CSCMM, two parameter terms, and a constant term, is referred to as the 2FA model. An exemplary method of fitting a 2FA model suitable for use in implementing step 340 will be described in more detail below with respect to FIGS. 7A-7B.

In the finance example, the 2FA model may include 2-parameter terms involving interest rate and exchange rate of appropriate orders, terms involving interest rate and volatility of appropriate orders, terms involving exchange rate and volatility of appropriate orders, as well as 2-parameter terms of other combinations of input parameters of appropriate orders.

At step 350, the 2FA model is evaluated at the previously selected stress points to determine whether the 2FA model represents a good fit to the SUS, such as described above with respect to the assessment of the 1FA model at step 330. If the 2FA model represents a good fit, then the CSCMM is set equal to the 2FA model and the method 300A exits at step 390. If the 2FA model does not represent a good fit, then the CSCMM is set equal to the 2FA model and the method 300A proceeds to step 360.

At step 360, the method 300A (e.g., via the EQE) improves the CSCMM (current SUS model) by adding N parameter terms and adjusting the constant. That is, at step 360, N-factor terms, where N is initially 3, of type $x_1^m$ $x_2^n x_3^o$ are systematically added to the CSCMM by considering triplets of input parameters to provide thereby a third fit approximation. Here m, n, and o are positive integers greater than zero and $x_1$, $x_2$, and $x_3$ are input parameters. The resulting model, which comprises a sum of the CSCMM, 3 parameter terms, and a constant term, is referred to as the 3FA model.

In the finance example, the 3FA model may include 3-factor terms involving interest rate, exchange rate, and volatility of appropriate orders as well as 3-factor terms of other combinations of three input parameters of appropriate orders.

At step 370, the 3FA model is evaluated at the previously selected stress points to determine whether the 3FA model represents a good fit to the SUS, such as described above with respect to the assessment of the 1FA model at step 330. If the 3FA model represents a good fit, then CSCMM is set equal to the 3FA model and the method 300A exits at step 390. If the 3FA model does not represent a good fit, then CSCMM is set equal to the 3FA model and the method 300A proceeds to step 380.

At step 380, the variable N is incremented and steps 360-370 are repeated. In particular, for each repetition of step 360, higher level polynomials may be added such as previously described to adapt the NFA model such that it is improved in terms of fit. That is, the loop process of steps 360-380 systematically increases the number of input parameters in a term added to the CSCMM by one to improve accuracy. If the resulting goodness of fit of the NFA model evaluated at step 370 is not good, then CSCMM is set equal to the NFA model and N is incremented at step 380, and steps 360 and 370 may be repeated. If at step 370, the NFA model represents a good fit, then CSCMM is set equal to the NFA model and the method 300A exits at step 390.

It is noted that the term NFA model implies that the model contains polynomial terms involving N parameters. For example, if N is 6, the terms being considered in the NFA analysis would be of type $x_1^m x_2^n x_3^o x_4^p x_5^q x_6^r$. Here m, n, o, p, q, and r are positive integers greater than zero and $x_1$, $x_2$, $x_3$, $x_4$, $x_5$, and $x_6$ are input parameters. For this example, the analysis would be called 6FA analysis and the resulting model which includes the 6-factor terms would be called the 6FA model.

In various embodiments, steps 360-370 are repeated only for a predetermined number of iterations, until a budget is exhausted, or until some other threshold event occurs.

Generally speaking, the limit of N may be selected as the dimensional limit DL of the user inputs. For example, if the User or System provides only 5 inputs, the DL is 5 and 5FA will be the maximum that RACE 105 can process. In another example, the number of input parameters could be 2 in which case the DL is 2 and 2FA will be the maximum that RACE 105 can process. In various embodiments, when the method 300 reaches the DL, then message is transmitted to the User or System indicative of this event to trigger thereby additional processes or interaction by the User or System.

At step 390, the SUS-characterizing mathematical model SCMM is set to the latest approximation model (CSCMM) from the preceding step and method 300A exits. Optionally, the SCMM is also simplified at step 390.

In various embodiments, the terminology N-tuplet of input parameters, where N is an integer greater than 0, is used to refer to a group of N input parameters. When N=1, N-tuplet refers to a single input parameter; when N=2, N-tuplet refers to a pair of input parameters; when N=3, N-tuplet refers to a triplet of input parameters; and so on.

In various embodiments, the terminology N-dimensional space, where N is an integer greater than 0, is used while working with a NFA process. When N=1, N-dimensional space stands for a straight line. When N=2, N-dimensional space stands for a plane. When N=3, N-dimensional space refers to a three dimensional space. When N>3, N-dimensional space stands for an N-dimensional hyper space.

Figure 3B:
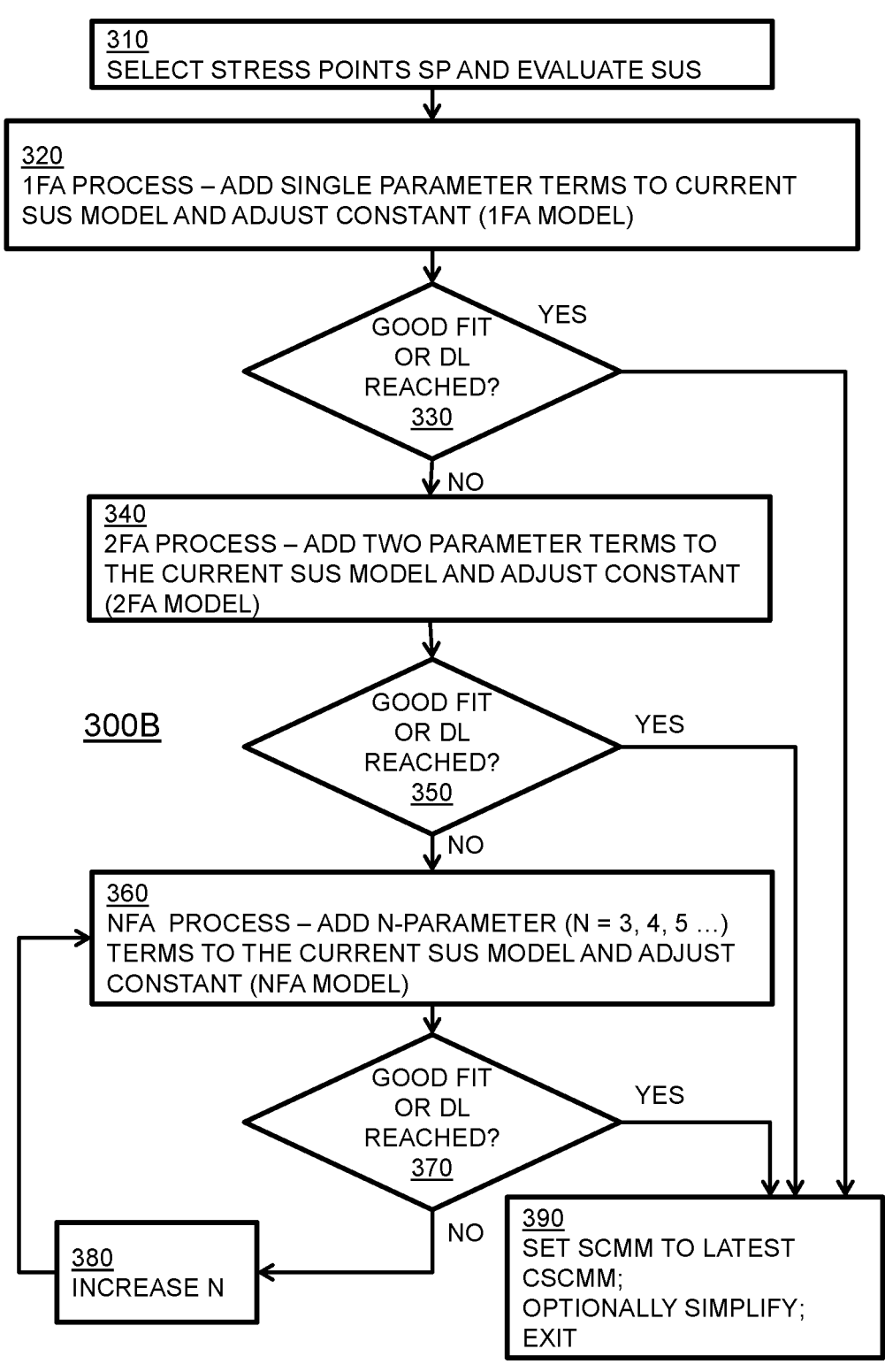

FIG. 3B depicts a method 300B according to one embodiment of step 220. Method 300B operates in substantially the same manner as described above with respect to the method 300A of FIG. 3A, except that at each of the evaluation steps 330, 350 and 370, an additional query is provided as to whether the dimensional limit DL has been reached. In each of these steps, if the query is answered affirmatively indicating that the DL has been reached (or the CSCMM is a good fit), then the method 300B exits at step 390.

FIG. 3C depicts a method 300C according to one embodiment of step 220. Method 300C operates in substantially the same manner as described above with respect to the method 300A of FIG. 3A, except that at each of the evaluation steps 330, 350 and 370, an additional query is provided as to whether a Constraint violation has occurred or a Constraint would be violated if the process moves forward by incrementing N in the NFA model. In each of the steps, if the query is answered affirmatively indicating that Constraint adherence has or would be ceased (or that the current SUS-characterizing mathematical model is a good fit), then the method 300C exits at step 390. A Constraint violation may comprise, illustratively, the reaching of a maximum number of SUS evaluations, the reaching of a maximum amount of time or resources for performing SUS evaluations and so on. In various embodiments, message may be sent to User or System indicative of a Constraint violation such that the User or System may responsibly reduce or remove one or more Constraints to permit further processing.

Figure 3D:
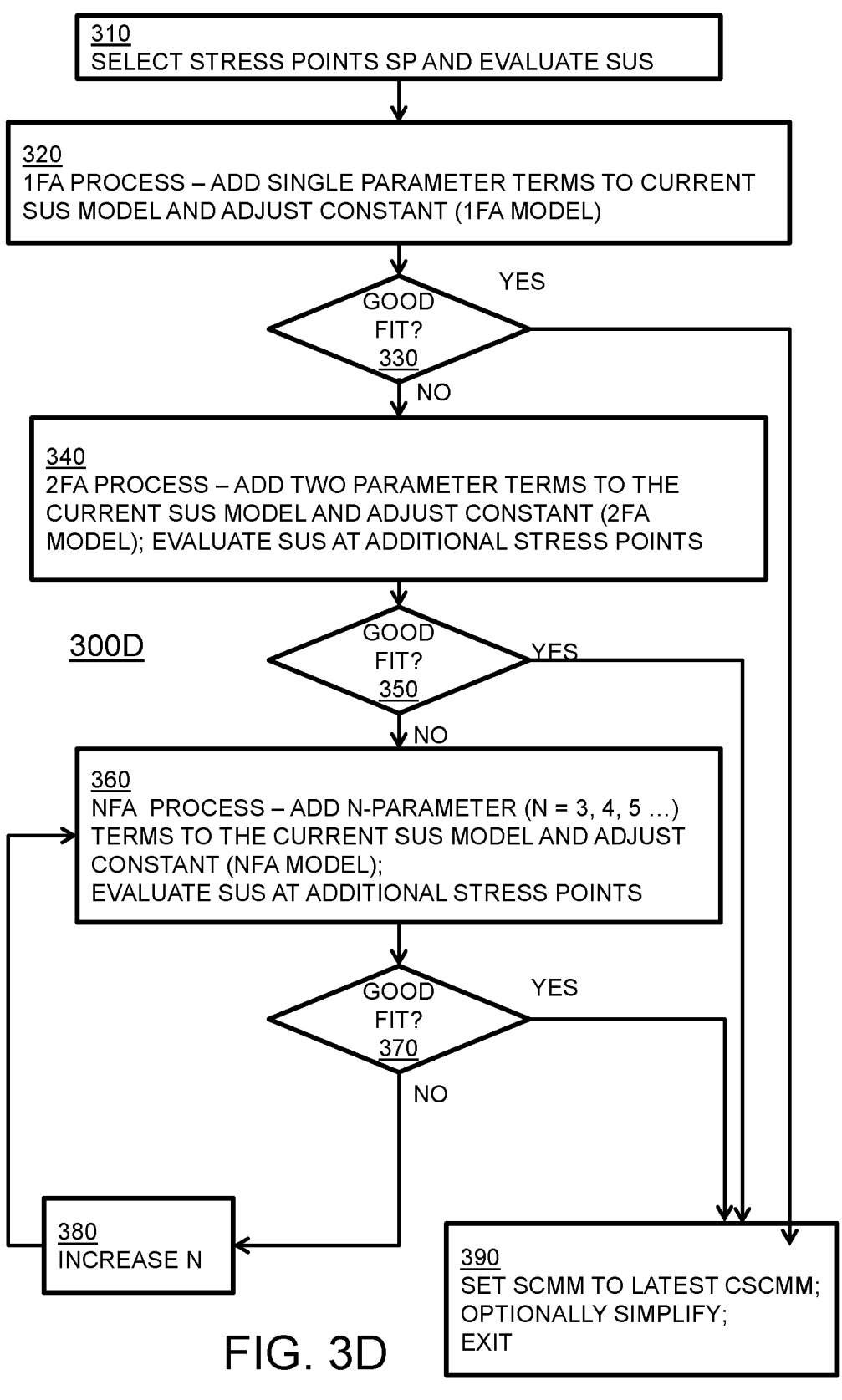

FIG. 3D depicts a method 300D according to one embodiment of step 220. Method 300D operates in substantially the same manner as described above with respect to the method 300A of FIG. 3A, except that at one or both of the 2FA evaluation steps 340-350 and NFA evaluation steps 360-370, additional stress points may be selected or otherwise adapted (e.g., via the TVE) prior to the evaluation of fit of the current SUS model. For example, a different orthogonal array or a different fractional factorial design may be selected for each NFA model such that a correspondingly different set of stress points is appropriate to evaluate the NFA model. As previously noted, stress points may be selected to expose the inability of a model to adequately match the SUS output. In various embodiments, SP may be selected using an orthogonal array. In other embodiments, SP may be selected using fractional factorial designs, full factorial designs, design of experiments, space filling designs, and/or other method.

New or additional stress points SP may be generated for certain analysis steps and not for others in various embodiments. For example, new or additional stress points SP may be generated for assessing goodness of fit of the 2FA and 5FA models while for assessing goodness of fit of the 3FA and 4FA models previously utilized stress points SP may be used. Determination of when stress points SP may be re-used or additional SP may be generated may depend on available information regarding goodness of fit in prior analysis steps, Constraints, and other User or System specified criteria. For example if additional SP are generated as shown in the relevant steps, the goodness of fit evaluation may be performed using both initial and additional SP.

Figure 3E:
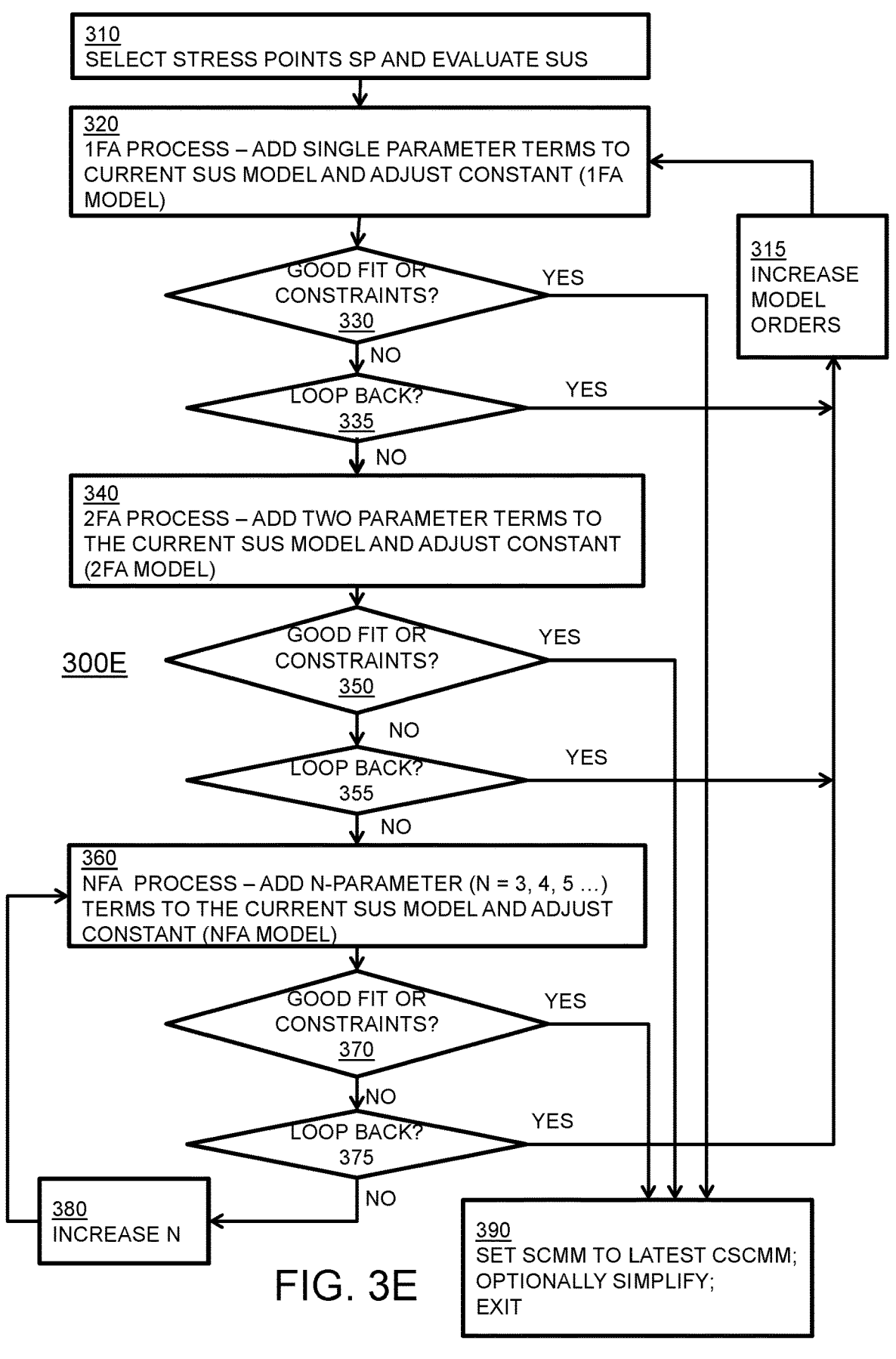

FIG. 3E depicts method 300E according to one embodiment of step 220. Method 300E operates in substantially the same manner as described above with respect to the method 300A of FIG. 3A, except that the process can loop back. Method 300E describes an embodiment where there are multiple passes through the 1FA, 2FA, NFA processes. In this embodiment, the CSCMM is improved by iteratively employing 1FA, 2FA, NFA processes to progressively improve accuracy in a loop back approach. The User or System may specify the progressive maximum orders and loop back criteria as Constraints for the polynomials in the 1FA, 2FA, NFA steps.

Illustratively, loop back criteria may specify that in a first pass, the maximum polynomial order for the 1FA process may be 2, for the second and for each subsequent pass the maximum polynomial order increases by 2, and loop back occurs when the method 300E is at step 335 for the $1^{st}$, $4^{th}$, and $7^{th}$ pass. For example, for the first pass the maximum polynomial order for the 2FA process may be 1, and the maximum order increases by 1 for each subsequent pass, and that loop back occurs only when the process is at step 355 for the 1st, $4^{th}$ and $7^{th}$ time. For example, for the first pass the maximum polynomial order for 3FA process may be 1, and so forth.

A maximum order of 1 for the 2FA process implies that none of the parameters in the two parameter terms may have an order greater than 1. Maximum polynomial orders for 3FA, 4FA, and so are interpreted similarly.

For the above illustration, in the first pass, the 1FA process of step 320 will improve the CSCMM by adding single parameter polynomials of up to order 2 and the method 300E will progress to step 330. Then the goodness of fit and constraints will be checked in step 330. If the goodness of fit and constraint criteria are met, then the method 300E will proceed to exit at step 390, else to step 335. Based on the above loop back criteria, the method 300E will then move to step 315 where the maximum polynomial order for 1FA process will be increased to 4. The method 300E will move to step 320 where the 1FA process will improve the CSCMM by adding single parameter terms up to $4^{th}$ order. After that, the method 300E will move to step 330. If the goodness of fit and constraint criteria are not met, then the method 300E will move to step 335. This being the second time the method 300E is at step 335, it will not loop back, instead it will move to step 340.

In this illustration, for the first pass through the 2FA process, the method 300E will exit step 340 when the order of the 2-parameter terms is 1 and will progress to step 350. If the goodness of fit and constraints criteria are met, then the method 300E will proceed to exit at step 390, else it will move to step 355 where the loop back criteria would be checked. Based on the loop back criteria for the illustration described above, the method 300E will move to step 315 where the maximum order for the 1FA process will be increased to 6 and maximum order for the 2FA process will be increased to 2.

In the above illustration, in step 320 single parameter terms of order up to 6 will be added to the CSCMM and the method 300E will move to step 330. In the event that the goodness of fit and constraints criteria are not met, the method 300E will move to step 335. Being the third pass, the method 300E will move to step 340 where 2-parameter terms of order up to 2 will be added to the CSCMM. If the goodness of fit criteria and constraints are not met, the method 300E will move to step 355, and then method 300E will proceed to step 360 as defined by the loop back criteria.

Similar to step 355, step 375 assesses loop back criteria for 3FA, 4FA, . . . , NFA processes. Per the loop back criteria, when provided, the method 300E loops back to step 315 and then to step 320.

It is envisioned that in some embodiments the loop back criteria may specify to skip/bypass certain steps. Illustratively, if max polynomial order has been met for 1FA process then step 320 will be skipped.

It will be appreciated by those skilled in the art that the method 300A of FIG. 3A may be modified in accordance with one or more of the modifications discussed above with respect to the methods 300B-300E of, respectively, FIGS. 3B-3E. That is, it is contemplated that various embodiments may comprise of combinations or aspects of method 300A, method 300B, method 300C, method 300D, and/or method 300E.

In various embodiments, it is contemplated that other classes of functions such as Fourier series, wavelets, and Walsh functions may be utilized instead of polynomials. In these embodiments, the various methodologies, processes, mechanism and the like operate in a substantially similar manner as described herein, except for various modifications that one skilled in the art would readily appreciate.

FIG. 4A depicts a flow diagram of method 400A of improving the fit of CSCMM to a SUS according to an embodiment and suitable for use in implementing step 320 of the methods 300A-300E depicted above with respect to FIGS. 3A-3E. This is also referred to as a first fit approximation process or 1FA process.

At step 410 (e.g., via the EQE), the list of candidate input parameters is initialized to all input parameters for the SUS. As previously noted, a dimensional limit DL is defined as the number of input parameters in the SUS. Thus, at step 410, each of the N input parameters within the DL is identified and selected for further processing as described herein.

At step 410, the 1FA model is initialized to a constant, typically zero, plus an initial approximation model. In various embodiments the initial approximation model is the latest CSCMM. In various embodiments, the initial approximation model is as provided by the User or System. In various embodiments the initial approximation model is zero. The 1FA model is then improved through various steps of method 400A of FIG. 4A described herein to obtain improved approximation for the SUS.

At step 420, ranking stress points RSP are selected (e.g., via the TVE) for the purpose of rank ordering the input parameters. The RSP may be generated using the same methods utilized for generating SP. In various embodiments, RSP may be generated using an orthogonal array. In other embodiments, RSP may be selected using fractional factorial designs, full factorial designs, space filling designs, and/or other methods. In various embodiments, RSP selection may be dependent on User input, System input and/or specified Constraints. At step 420, the method 400A (e.g., via the HSSHI) evaluates the SUS at the RSP.

At step 430, the current 1FA model is evaluated at RSP (e.g., via the EQE) and a difference between the evaluations of the SUS and the current 1FA model is computed at the corresponding RSP.

At step 440, the main effects (single parameter effects) of all input parameters are computed (e.g., via the EQE). That is, a computation is made to determine the main effects of all input parameters on the difference between the SUS and current 1FA model (i.e., SUS minus current 1FA model). In various embodiments, sum of squares, F-statistics and/or other statistics are also computed. Main effects, sum of squares, F-statistics and/or other statistics may be used to define the importance and/or rank order of the input parameters. One skilled in the art will appreciate that computing main effects, sum of squares, F-statistics and the like are standard statistical methods in design of experiments and regression analysis. The input parameters may be rank ordered by importance. Alternatively, the input parameters can also be rank ordered per other criteria, such as presumed importance (rather than actual importance) based upon prior importance data or other information, User or System inputs, order of input parameter entry, random order, alphabetical order or other criteria.

At step 450, the method 400A (e.g., via the EQE) selects the input parameter from among the candidate parameters having the highest rank (illustratively, with the largest effect) as the current dominant input parameter. This selection may be based on the sum of squares, F-statistic values for the input parameters, and/or other criteria.

At step 450, the method 400A also examines if the effect of an input parameter that was previously selected as a dominant input parameter is large compared to the effects of the current candidate parameters. If so, the aliasing property of the RSP may be used to identify potential interacting input parameters in step 750 of method 700A, described below, for selecting a dominant input parameter pair. Alternatively, if the effect of an input parameter that was previously selected as a dominant input parameter is large compared to the effects of the current candidate parameters, that information may be used in determining the polynomial order for that input parameter in future iterations.

At step 460, method 400A (e.g., via the EQE) generates a polynomial for the current dominant input parameter for use in the 1FA. It is noted that the order of polynomial, associated test vectors, polynomial estimation points and the like associated with the current dominant input parameter may be selected as described herein with respect to the various figures. In various embodiments, the polynomial may be constructed with origin at or near the center point CP. In various embodiments, where origin is not at the center point CP, the polynomial may be transformed so the origin is at or near the center point CP.

At step 470, the method 400A (e.g., via the EQE) updates the current 1FA model by adding the polynomial for the current dominant input parameter generated in step 460. Here the constant term is adjusted, if necessary, so that the evaluations of the SUS and the updated 1FA model match at CP. In various embodiments, the constant term may be adjusted so that the evaluations of SUS and the updated 1FA model match at a suitable point in the region of interest RI. Also, the current dominant input parameter is removed from the candidate input parameter list.

At step 480, the method 400A (e.g., via the EQE) evaluates the current 1FA model at the previously selected stress points from step 310 to determine whether the 1FA model represents a good fit to the SUS, such as described herein with respect to the various figures. If the 1FA model represents a good fit, then the method 400A exits at step 490. Otherwise, the method 400A proceeds to step 485.

At step 485, the method 400A (e.g., via the EQE) makes a query as to whether all DL input parameters have been processed (i.e., there are no more input parameters in the candidate input parameter list). If yes, the method 400A exits at step 490. If not, the process loops back to step 430. The loop continues until a good fit is attained or all input parameters are exhausted. In each loop, steps 430-480 are repeated.

It is noted that less than DL input parameters may be used to generate the final 1FA model if the subset of DL input parameters processed provide a 1FA model of sufficient accuracy.

At step 490, the method 400A sets CSCMM equal to the latest 1 FA model from the latest pass through the step 470, which is an improved approximation model. Method 400A exits at step 490.

Figure 4B:
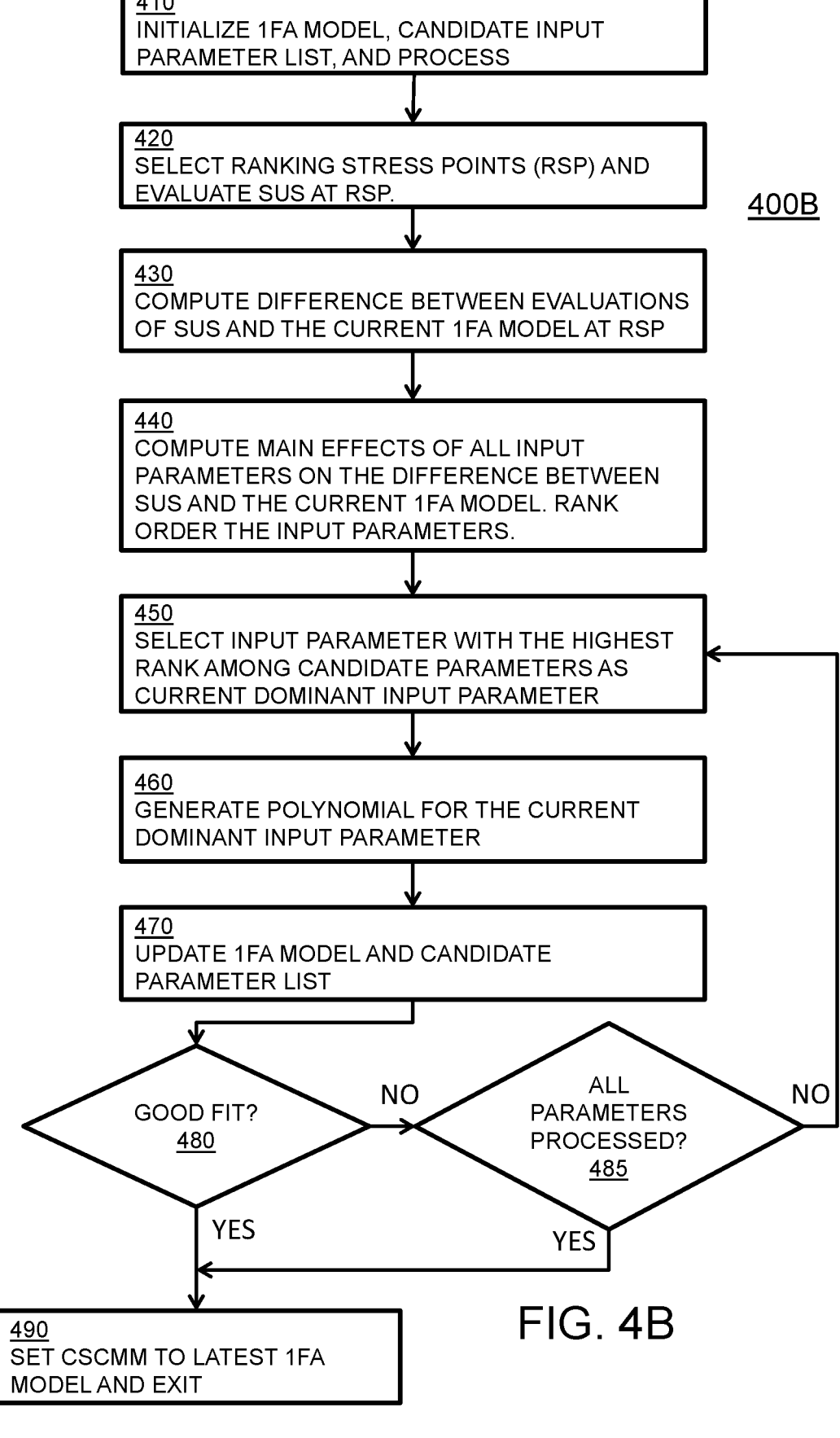

FIG. 4B depicts a flow diagram of method 400B of improving the fit of CSCMM to a SUS according to an embodiment and suitable for use in implementing step 320 of the methods 300A-300E depicted above with respect to FIGS. 3A-3E. This is also referred to as a first fit approximation process or 1FA process. The steps of FIG. 4B are similar to FIG. 4A with the exception of step 485. If all input parameters are not processed, the method 400B moves to step 450. In this embodiment, prioritization of input parameters is performed one time.

In various embodiments of method 400B of FIG. 4B, steps 420 and 430 are skipped. In step 440 calculations of main effects are also skipped and rank ordering is done in random order, in the order the input parameters were entered by the user, or a convenient order. The step 480 is skipped, so that after step 470, the method 400B moves directly to step 485. In these embodiments, the method 400B builds a polynomial model for all input parameters and includes them in the 1FA model.

In various embodiments of methods 400A and 400B of FIGS. 4A and 4B, respectively, the goodness of fit criteria of step 480 may be adapted such that goodness of fit is assessed only when a specified set of input parameters is included in the 1FA model. That is, in the cases that polynomials for a specified set of input parameters have not been included in the 1FA model, in various embodiments the step 480 is adapted such that the check for goodness of fit is set to "not a good fit" and the method proceeds to step 485.

A specified set of input parameters may comprise all input parameters, a subset of the input parameters, or one input parameter and may be determined by User input, System input, default settings, or Constraints. In these various embodiments, step 420 and/or step 430 are adapted such that they may be skipped. In various embodiments, step 440 may be adapted such that main effects of input parameters are not computed and rank ordering is determined by presumed importance, past data, random order, user or system specification, alphabetical order, or another convenient method as specified by User, System or default.

FIG. 5 depicts a flow diagram of a method of generating a fitted polynomial model for an input parameter associated with a SUS. The method 500 of FIG. 5 is suitable for use in the various other methods discussed herein with respect to the various figures.

At step 510, a plurality of points, illustratively n points, are selected (e.g., via the TVE) along the Axis Parallel Line APL for the current dominant input parameter. These points are referred to as APL points and also as modeling generation points since they are used for fitting a polynomial model. In essence, these model generation points are 1-dimensional grid points. The current dominant input parameter is also referred to as the selected input parameter. An Axis Parallel Line APL for an input parameter is denoted herein as a line parallel to the axis of that input parameter which passes through the Center Point CP.

Here, n is defined as a positive integer larger than 1 (e.g., 2, 3, . . . ). n may be the same or different for each input parameter. APL points may be positioned to span a region of interest RI based on probability distribution associated with the input parameter or its specified region of interest. Further, a starting (e.g., initial) value of n or a max value of n may be derived from User input, System input, or other information.

In various embodiments, the n points on the APL may be equally spaced from each other and symmetrically distributed with respect to the CP so that the centroid of these points coincides with the CP. In various embodiments, the n points may be positioned along the APL of an input parameter in a manner intended to span the region of interest for the parameter to a significant degree (e.g., 20%, 60%, 80%, or other percent of the RI). For example, FIG. 6A graphically depicts a n-point (here n=3) distribution where three equispaced points at locations $x_1$, $x_2$, and $x_3$ may be selected to be symmetrically positioned with respect to the Center Point CP. Let $\bar{x}$ denote the average value of the selected points. Here $\bar{x}$ is equal to $(x_1+x_2+x_3)/3$. Thus, in this example, $\bar{x}$ coincides with the x coordinate of CP. In another example depicted in FIG. 6B, four points are shown selected for the same parameter. These points are positioned at $x_1$, $x_2$, $x_3$, and $x_4$.

At step 520, the method 500 evaluates the SUS (e.g., via the HSSHI) at the selected APL points in step 510.

At step 530, the method 500 fits or generates a (n−1) order polynomial by solving n equations in n unknowns for the current dominant input parameter. Various processes and manipulations illustrative of embodiments of step 530 will now be described as being performed using the Equation Engine 121-EQE discussed above with respect to FIG. 1, though other functional elements may also perform these steps.

Generating a Polynomial Model for an Input Parameter

Figure 6A:
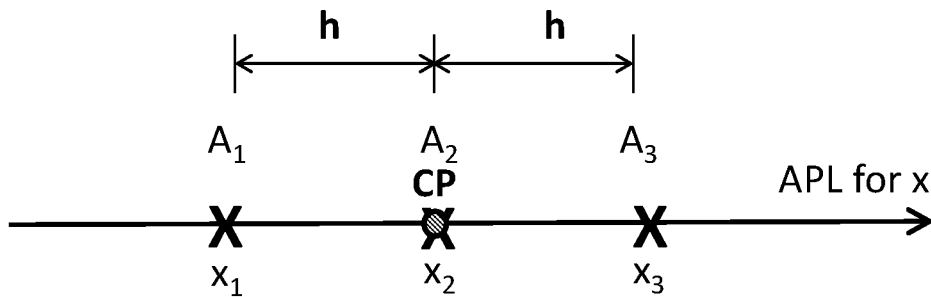
FIGS. 6A-6C graphically depict n-point distributions useful in understanding the various embodiments.

For example, and referring to the three points depicted in FIG. 6A for input parameter x, the method 500 generates three vectors (e.g., via the TVE) corresponding to the three points. Each vector has DL components corresponding to the values of the DL input parameters. The points may be positioned along the APL for parameter x at the coordinate values $x_1$, $x_2$, and $x_3$; and the spacing between adjacent points is h. The average of $x_1$, $x_2$, and $x_3$ is $\bar{x}$, which is equal to the x coordinate of CP. The values of the other input parameters may be set at the respective coordinates of the CP. The method 500 then evaluates the SUS (e.g., via the HSSHI) at the three points at $x_1$, $x_2$, and $x_3$ to provide thereby evaluation results as $y_1$, $y_2$, and $y_3$ respectively. An exemplary polynomial to be fitted in this example is provided by the following equation:

$$y = b_0 + b_1(x - \bar{x}) + b_2(x - \bar{x})^2 \qquad \text{(Eq. 1)}$$

Polynomials of other types/structures and other classes of functions may also be used for this purpose.

The three SUS evaluations provide the following three simultaneous equations (Eqs. 2A-2C):

$$y_1 = b_0 + b_1(x_1 - \bar{x}) + b_2(x_1 - \bar{x})^2 \qquad \text{(Eq. 2A)}$$

$$y_2 = b_0 + b_1(x_2 - \bar{x}) + b_2(x_2 - \bar{x})^2 \qquad \text{(Eq. 2B)}$$

$$y_3 = b_0 + b_1(x_3 - \bar{x}) + b_2(x_3 - \bar{x})^2 \qquad \text{(Eq. 2C)}$$

These three linear equations in three unknowns ($b_0$, $b_1$, and $b_2$) may be solved by any one of the standard methods of solving simultaneous linear equations, such as matrix inversion, successive substitution, Lagrange polynomials and the like.

In an alternate embodiment, a polynomial is fit/generated using a polynomial expressed as Eq.1 rewritten as a sum of orthogonal polynomials. For example, one approach is to construct the Vandermonde matrix, which for the embodiment with three points is shown below in Eq. 3a:

$$V = \begin{bmatrix} 1 & (x_1 - \bar{x}) & (x_1 - \bar{x})^2 \\ 1 & (x_2 - \bar{x}) & (x_2 - \bar{x})^2 \\ 1 & (x_3 - \bar{x}) & (x_3 - \bar{x})^2 \end{bmatrix} \qquad \text{(Eq. 3a)}$$

Then, the columns of the matrix V are successively orthogonalized (e.g., via the EQE) leading to the following matrix V* as shown below in Eq. 3b:

$$V^* = \begin{bmatrix} 1 & (x_1 - \bar{x}) & (x_1 - \bar{x})^2 - (2/3)h^2 \\ 1 & (x_2 - \bar{x}) & (x_2 - \bar{x})^2 - (2/3)h^2 \\ 1 & (x_3 - \bar{x}) & (x_3 - \bar{x})^2 - (2/3)h^2 \end{bmatrix} \qquad \text{(Eq. 3b)}$$

The column vectors of the V* matrix are mutually orthogonal and imply the following orthogonal polynomials:

$$P_0(x - \bar{x}) = 1 \qquad \text{(Eq. 4)}$$

$$P_1(x - \bar{x}) = (x - \bar{x}) \qquad \text{(Eq. 5)}$$

$$P_2(x - \bar{x}) = (x - \bar{x})^2 - (2/3)h^2 \qquad \text{(Eq. 6)}$$

Using the orthogonal polynomials, the method 500 adapts Eq. 1 as a sum of orthogonal polynomials such as shown below in Eq. 7, where $B_i$ are coefficients:

$$y = \sum_{i=0 \text{ to } 2}\{B_i P_i (x - \bar{x})\} \tag{Eq. 7}$$

To calculate the coefficient $B_\alpha$, where $\alpha$ is 0, 1, or 2, the method 500 multiplies both sides of Eq. 7 by $P_\alpha(x-\bar{x})$ and sums both sides over the sample points $x_1$, $x_2$, and $x_3$. The method 500 then solves the resulting equation for $B_\alpha$ for $\alpha=0$ to 2, to provide the result shown below as Eq. 8:

$$B_\alpha = (\text{numerator\_Eq8})/(\text{denominator\_Eq8}) \tag{Eq. 8}$$

$$\text{where numerator\_Eq8} = \sum_{j=1 \text{ to } 3}\{y_j P_\alpha(x_j - \bar{x})\}; \text{ and}$$

$$\text{denominator\_Eq8} = \sum_{j=1 \text{ to } 3}\{P_\alpha^2(x_j - \bar{x})\}$$

Figure 6B:
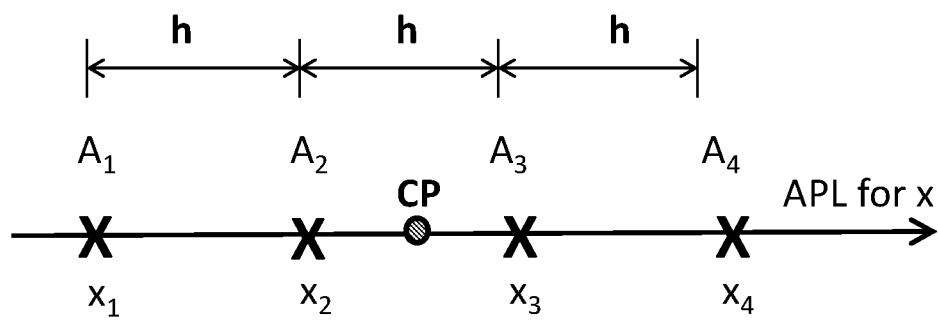
Figure 6C:
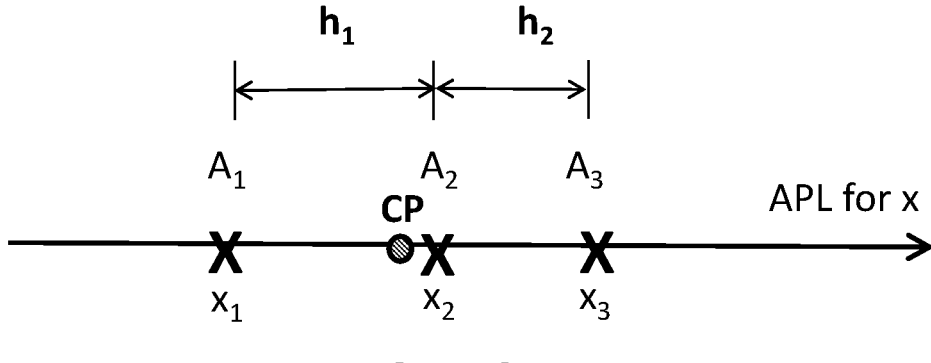

In an embodiment graphically depicted with respect to FIG. 6C, the points $x_1$, $x_2$, and $x_3$ are not equally spaced. For that embodiment, method 500 (e.g., via the EQE) uses one of the several methods described herein for fitting a polynomial. For example, method 500 (e.g., via the EQE) may use Eq. 1 to represent the polynomial and solve Eq. 2A-2C to compute the coefficients $b_0$, $b_1$, and $b_2$ by using the prescribed methods.

Those skilled in the art will readily note that the terms fit a polynomial, generate a polynomial, and construct a polynomial refer to substantially the same process and may be used interchangeably.

In the embodiment with four points (n=4) shown in FIG. 6B, at step 530, the method (e.g., via the EQE) fits an (n−1) order polynomial by solving n equations in n unknowns. The method 500 (e.g., via the TVE) generates four vectors corresponding to the four points. Each vector has DL components corresponding to the DL input parameters. The points may be positioned along the APL for the parameter x at the coordinate values $x_1$, $x_2$, $x_3$, and $x_4$ with a spacing of h between adjacent points. The average of $x_1$, $x_2$, $x_3$, and $x_4$ is $\bar{x}$, which is equal to the x coordinate of CP. The values of the other input parameters may be set at the respective coordinates of the CP. The method 500 (e.g., via the HSSHI) evaluates the SUS at the four points and the evaluation results are denoted as $y_1$, $y_2$, $y_3$, and $y_4$ respectively. The polynomial to be fitted for this embodiment may be expressed by the following equation:

$$y = b_0 + b_1(x - \bar{x}) + b_2(x - \bar{x})^2 + b_3(x - \bar{x})^3 \tag{Eq. 9}$$

The four SUS evaluations provide the following four simultaneous equations:

$$y_1 = b_0 + b_1(x_1 - \bar{x}) + b_2(x_1 - \bar{x})^2 + b_3(x_1 - \bar{x})^3 \tag{Eq. 10A}$$

$$y_2 = b_0 + b_1(x_2 - \bar{x}) + b_2(x_2 - \bar{x})^2 + b_3(x_2 - \bar{x})^3 \tag{Eq. 10B}$$

$$y_3 = b_0 + b_1(x_3 - \bar{x}) + b_2(x_3 - \bar{x})^2 + b_3(x_3 - \bar{x})^3 \tag{Eq. 10C}$$

$$y_4 = b_0 + b_1(x_4 - \bar{x}) + b_2(x_4 - \bar{x})^2 + b_3(x_4 - \bar{x})^3 \tag{Eq. 10D}$$

The method 500 (e.g., via the EQE) solves these four linear equations in four unknowns ($b_0$, $b_1$, $b_2$, and $b_3$) by one of the standard methods of solving simultaneous linear equations. These methods include matrix inversion, successive substitution, Lagrange polynomials, and other.

Another method utilized by the method 500 to fit a polynomial is to rewrite Eq. 9 as an orthogonal polynomial expansion. One approach is to construct the Vandermonde matrix (denoted as matrix V), and then successively orthogonalize the columns of the matrix V to generate matrix V. The column vectors of matrix V* are mutually orthogonal and imply the following orthogonal polynomials (Eqs. 11A-11D). The details of this process are substantially the same as the above-described embodiment with three points. In particular, the following equations for orthogonal polynomials are provided for this 4 point example:

$$P_0(x - \bar{x}) = 1 \tag{Eq. 11A}$$

$$P_1(x - \bar{x}) = (x - \bar{x}) \tag{Eq. 11B}$$

$$P_2(x - \bar{x}) = (x - \bar{x})^2 - (5/4)h^2 \tag{Eq. 11C}$$

$$P_3(x - \bar{x}) = (x - \bar{x})^3 - (41/20)(x - \bar{x})h^2 \tag{Eq. 11D}$$

Using the orthogonal polynomials, the method 500 expresses Eq. 9 in the form of an orthogonal polynomial expansion, as shown below with respect to Eq. 12, where and $B_i$ for i=0, 1, 2, and 3 are the coefficients.

$$y = \sum_{i=0 \text{ to } 3}\{B_i P_i (x - \bar{x})\} \tag{Eq. 12}$$

To calculate the coefficients $B_\alpha$, where $\alpha$ is 0, 1, 2, or 3, the method 500 multiplies both sides of Eq. 12 by $P_\alpha(x-\bar{x})$ and sums both sides over the points $x_1$, $x_2$, $x_3$, and $x_4$. Then the method 500 solves the resulting equation for $B_\alpha$ for $\alpha=0$ to 3.

In various embodiments, illustratively while conducting hardware experiments/tests, evaluations of the SUS may be conducted at points near the specified modeling points rather than exactly at the specified modeling points.

In various embodiments, illustratively for convenience of evaluation of the SUS or other reasons, the model generation points may be selected as indicated above with some offset causing the model generation points to be close to the axis parallel line, but not exactly on the axis parallel line. In various embodiments, for subsequent analyses, such as generation of polynomials, the model generation points may be treated as though they are at their respective closest locations on the APL. In various embodiments, for subsequent analyses the actual coordinates of the model generation points may be used in conjunction with general linear models analysis.

At step 540 the method 500 (e.g., via the TVE) generates one or more additional points and corresponding vectors with DL components corresponding to the values of the DL input parameters. The additional points, called Axis Parallel Line Stress Points ASP, may be positioned along the APL for the input parameter x within the RI and may be distinct from the points used for generating the polynomial model in the preceding step 530. For example, in the embodiment with 3 points shown in FIG. 6A, the additional point(s) would be distinct from the points $A_1$, $A_2$, and $A_3$ (positioned at $x_1$, $x_2$, and $x_3$ respectively). The values of the other input parameters may be set at the respective coordinates of the CP.

At step 550, the method 500 (e.g., via the HSSHI) evaluates the SUS and the polynomial model for x generated in step 530 at the ASP, and then (e.g., via the EQE) evaluates the difference between the evaluations of the SUS and the polynomial model for x generated in step 530 at the corresponding ASP.

At step 560, the adequacy of the polynomial model for input parameter x generated in step 530 is tested by method 500. That is, at step 560 a determination is made as to whether the generated model for the current dominant input parameter is a good fit with respect to the evaluations of the SUS along the APL for that parameter. If the difference computed in step 550 is within a User, System or default specification, then the polynomial order is considered adequate (i.e., a good fit) and the method 500 proceeds to step 590. If the difference is outside of the User, System or default specification (i.e., not a good fit), then the method 500 proceeds to step 570.

At step 570, a determination is made by method 500 (e.g., via the EQE) as to whether a maximum polynomial order has been reached. If the maximum polynomial order has not been reached, then the method proceeds to step 580. Otherwise the method 500 optionally provides a message to the User (e.g., via the HSSHI) and proceeds to step 590. In various embodiments, the User or the System may specify the polynomial order to use, in which case, both the starting polynomial order and the maximum polynomial order are set equal to the specified polynomial order. For example, if the polynomial order was specified as 4, n would be set to 5 in order to fit a (n−1) order polynomial, i.e., a $4^{th}$ order polynomial. This may be specified in the default settings, configurations, or by means of Constraints.

At step 580, method 500 (e.g., via the EQE) increases the polynomial order by increasing the number of points along the APL of the current dominant input parameter by one or more such that the corresponding polynomial order is increased to the new number of points minus one. Steps 510-560 are then repeated until the difference between the SUS and polynomial model evaluations is within User, System or default specifications.

At step 590, method 500 (e.g., via the EQE) removes the constant term from the polynomial model generated in latest step 530.

At step 590, in the case that the origin of the coordinate system is not at the CP, the polynomial built in the latest step 530 is transformed by shifting the origin to the center point CP; constant term is removed from the transformed polynomial; and the resulting polynomial is transformed again by shifting the origin from CP back to the original origin.

Optionally at step 590, the method 500 simplifies the polynomial by evaluating the contribution of each remaining polynomial term and removing any term that does not provide sufficient contribution as specified by the User or System.

The method 500 exits at step 590.

In various embodiments, step 570 is adapted such that the check for attaining maximum polynomial order is set to "yes" so that method 500 moves from step 570 to step 590 and does not go to step 580. That is, method 500 is adapted to not iterate and increase the polynomial order.

In various embodiments, step 540 is adapted such that ASP are not selected. That is, method 500 is adapted to skip step 540. In various embodiments, step 550 is adapted such that computation of difference between the SUS and the polynomial at ASP is not done. That is, method 500 is adapted to skip step 550. In various embodiments, step 560 is adapted such that the check for good fit is set to "yes" so that method 500 moves from step 560 to step 590. That is, method 500 is adapted to not iterate and increase the polynomial order.

For example, in an embodiment with two input parameters u and v, both being approximated by second order polynomials, the summed polynomial at step 470 of methods 400A-400B of, respectively, FIGS. 4A-4B may take the following form:

$$y = b_{00} + b_{11}(u - \bar{u}) + b_{12}(u - \bar{u})^2 + b_{21}(v - \bar{v}) + b_{22}(v - \bar{v})^2 \quad \text{(Eq. 13)}$$

Here $\bar{u}$ is the average of the u coordinates of the three points selected in computing the polynomial for input parameter u in step 460. Likewise, $\bar{V}$ is the average of the v coordinates of the three points selected in computing the polynomial for input parameter v in step 460. Here $b_{12}$, $b_{21}$, and $b_{22}$ are coefficients computed in step 460.

The constant boo is such that the polynomial (Eq. 13) evaluation matches the SUS evaluation at the CP.

It should be noted that the various input parameters could use the same order polynomials or different order polynomials. That is, it is not necessary for the all input parameters to have the same order polynomial. For example, u could have a $3^{rd}$ order polynomial (i.e., a term with $u^3$) and v could have a $4^{th}$ order polynomial (i.e., a term with $v^4$).

FIG. 7A depicts a flow diagram of method 700A of improving the fit of CSCMM to a SUS according to an embodiment and suitable for use in implementing step 340 of the methods 300A-300E depicted above with respect to FIGS. 3A-3E. This is also referred to as a second fit approximation process or 2FA process. In various embodiments, the method 700A of FIG. 7A is adapted to provide an improved CSCMM in which the input parameter pairs having the most effect on the model may be successively selected for use in generating polynomials used within the improved CSCMM.

At step 710, the method 700A (e.g., via the EQE) initializes the candidate input parameter pair list to all possible input parameter pairs.

At step 710, the 2FA model is initialized to a constant, typically zero, plus an initial approximation model. In various embodiments the initial approximation model is the latest CSCMM. In various embodiments, the initial approximation model is as provided by the User or System. In various embodiments the initial approximation model is zero. The 2FA model is then improved through various steps of method 700A of FIG. 7A described herein to obtain improved approximation model for the SUS.

At step 720, the method 700A (e.g., via the TVE) generates a plurality of points within the region of interest RI of the input parameter space for the purpose of rank ordering the input parameter pairs. These points are referred as ranking stress points RSP. The RSP of method 700A may or may not be the same as those for the methods 400A-400B. The RSP are generated using the same methods utilized for generating SP, namely, they could be generated using orthogonal arrays, fractional factorial designs, full factorial designs, or other methods. However, the RSP need not be the same as the SP. For example, SP may be generated using 2-level orthogonal arrays and RSP may be generated using 3-level orthogonal arrays. At step 720, the method 700A (e.g., via the HSSHI) evaluates the SUS at the RSP.

At step 730, the method 700A (e.g., via the EQE) evaluates the current 2FA model at the RSP and then computes the difference between the SUS evaluations and the current 2FA model evaluations at the corresponding RSP (SUS evaluation minus the 2FA evaluation).

At step 740, the method 700A (e.g., via the EQE) computes the 2 parameter interactions for each input parameter pair using the difference in the evaluations computed in step 730. The interaction for each pair of parameters may be summarized as the largest absolute difference, sum of absolute differences, mean square of selected top absolute differences, mean square error, or other.

In various embodiments, interaction values may be calculated for all pairs of input parameters. In one embodiment where there are 4 input parameters (labeled u, v, w, and x) the process may select 8 RSP according to an orthogonal array L8 of Table 1 leading to the 8 vectors according to Table 2. Assume $y_i^*$ for i=1 to 8 are the computed differences in step 730 corresponding to the 8 RSP. The process computes the level pair average for parameters u and v at $(u_1, v_1)$ by identifying the stress points where the level pair $(u_1, v_1)$ occurs, and averaging the corresponding $y_i^*$ values. Here, the level pair average for $(u_1, v_1)$ is given by $L(u_1, v_1)$ as follows:

$$L(u_1, v_1) = (y_1^* + y_2^*)/2 \qquad \text{(Eq. 14)}$$

The other level pair averages of u and v at $(u_1, v_2)$, $(u_2, v_1)$, and $(u_2, v_2)$ are computed similarly. Likewise level pair averages for all pairs of input parameters are calculated. In this embodiment there are 6 possible pairs of input parameters and for each pair there are 4 possible level pairs. Accordingly, the number of computations will be 4 times 6, which is equal to 24 in this example.

In various embodiments, the level pair averages define the importance of input parameter pairs.

At step 750 (e.g., via the EQE), the input parameter pairs are rank ordered by importance. Alternatively, the input parameters can also be rank ordered per other criteria, such as presumed importance (rather than actual importance) based upon prior importance data or other information, User or System inputs, order of input parameter entry, random order, alphabetical order or other criteria. The input parameter pair with the largest rank (e.g., largest interaction effect), denoted illustratively herein as u and v, is selected from the current candidate input parameter pairs.

In various embodiments, the largest absolute value among the 24 values is selected to decide the current dominant interaction pair. Interaction pair is also referred as input parameter pair. Illustratively, if absolute value of $L(u_1, w_1)$ is the largest, then the input parameter pair (u, w) would be selected as the current dominant interaction pair. At step 750 (e.g., via the EQE), for this embodiment, if the absolute value of $L(v_1, w_2)$ is the largest, then the input parameter pair (v, w) would be selected as the current dominant interaction pair.

In various embodiments, the process calculates the mean sum of square of the 4 level pair averages associates with each input parameter pair. Thus, for input parameter pair (u, v) the process calculates the mean sum of squares, S(u, v), as follows:

$$S(u, v) = \{L(u_1, v_1)^2 + L(u_1, v_2)^2 + L(u_2, v_1)^2 + L(u_2, v_2)^2\}/4 \qquad \text{(Eq. 15)}$$

There would be 6 such mean sum of square values corresponding to the 6 input parameter pairs. In various embodiments mean sum of square values of level pair averages for specific parameter pairs define importance. The largest importance determines the current dominant interaction pair.

The current dominant interaction pair is also referred to as current dominant input parameter pair, or selected input parameter pair, or selected interaction pair or the like.

At step 760, the method 700 (e.g., via the EQE) constructs a two parameter polynomial involving the current dominant input parameter pair, illustratively depicted by u and v. It is noted that the orders of 2-parameter polynomial terms, associated test vectors, polynomial estimation points and the like associated with the current dominant input parameter pair may be selected as described herein with respect to the various figures. In various embodiments, the polynomial may be constructed with origin at or near the center point CP. In various embodiments, where origin is not at the center point CP, the polynomial may be transformed so the origin is at or near the center point CP.

At step 770, the method 700A updates the current 2FA model by adding the polynomial for the current dominant input parameter pair generated in step 760. Here the constant term is adjusted, if necessary, so that the evaluations of the SUS and the updated 2FA model match at CP. In various embodiments, the constant term is adjusted so that the evaluations of SUS and the updated 2FA model match at a suitable point in the region of interest RI. Also, the current dominant input parameter pair is removed from the candidate input parameter pair list.

At step 780, the method 700A (e.g., via the EQE) evaluates the current 2FA model (updated in step 770) at stress points SP. The evaluations of the 2FA model at the SP are compared to the evaluations of the SUS at the corresponding SP. The method 700 measures "goodness" of fit by using a maximum absolute difference, a sum of absolute differences, a mean square of selected top absolute differences, a mean square error, or other techniques. If fit is within User specified, System specified or default limits, the method 700A exits at step 790. If the fit is outside User specified, System specified, or default limits, then the method 700A proceeds to step 785.

At step 785, the method 700A (e.g., via the EQE) determines whether all candidate input parameter pairs have been exhausted (i.e., the candidate input parameter list is empty). If all input parameter pairs are exhausted, the method 700A proceeds to step 790. If all input parameter pairs are not exhausted, then the method loops back to step 730. Steps 730-780 are executed until good fit is attained or all candidate input parameter pairs are exhausted, at which point the method exits at step 790.

At step 790, the method 700A sets CSCMM equal to the latest 2FA model from the latest pass through the step 770, which is an improved approximation model. Method 700A exits at step 790.

FIG. 7B depicts a flow diagram of method 700B of fitting a 2FA model, second fit approximation, to a SUS (2FA process) according to an embodiment and suitable for use in implementing step 340 of the methods 300A-300E depicted above with respect to FIGS. 3A-3E. The steps 710 to 780 are the same as described in method 700A. In the case that all pairs of parameters are not exhausted at step 785, the method 700B proceeds to step 750, instead of step 730 as depicted in method 700A. In method 700B, interaction and prioritization analysis is computed one time and the results are used for all iterations of pairs of input parameters as opposed to in method 700A where interaction and prioritization analysis is computed each time a new input parameter pair is to be processed and removed from the candidate input parameter list.

In various embodiments of methods 700A and 700B of FIGS. 7A and 7B, respectively, the goodness of fit criteria of step 780 may be adapted such that goodness of fit is assessed only when a specified set of input parameter pairs is included in the 2FA model. That is, in cases where polynomials for a specified set of input parameter pairs have not been included in, illustratively, the 2FA model, in various embodiments the step 780 is adapted such that the check for goodness of fit is set to "not a good fit" and the method proceeds to step 785. A specified set of input parameter pairs may comprise all input parameter pairs, a subset of the input parameter pairs, or one input parameter pair and may be determined by User input, System input, default settings, or Constraints. In these various embodiments, step 720 and/or step 730 may be skipped. In various embodiments, step 740 may be adapted such that effects of input parameter pairs are not computed and rank ordering is determined by presumed importance, past data, random order, user or system specification, alphabetical order, or another convenient method as specified by User, System, or default.

In various embodiments, methods 700A-700B are adapted so step 780 is skipped. The method 700A or 700B moves from step 770 directly to step 785. That is, in various embodiments, all input parameter pairs are processed.

It will be appreciated by one skilled in the art that methods 700A-700B are similar in process and computation to methods 400A-400B except that the polynomials terms generated in methods 400A-400B involve one parameter and polynomials terms generated in methods 700A-700B involve two parameters.

Figure 8:
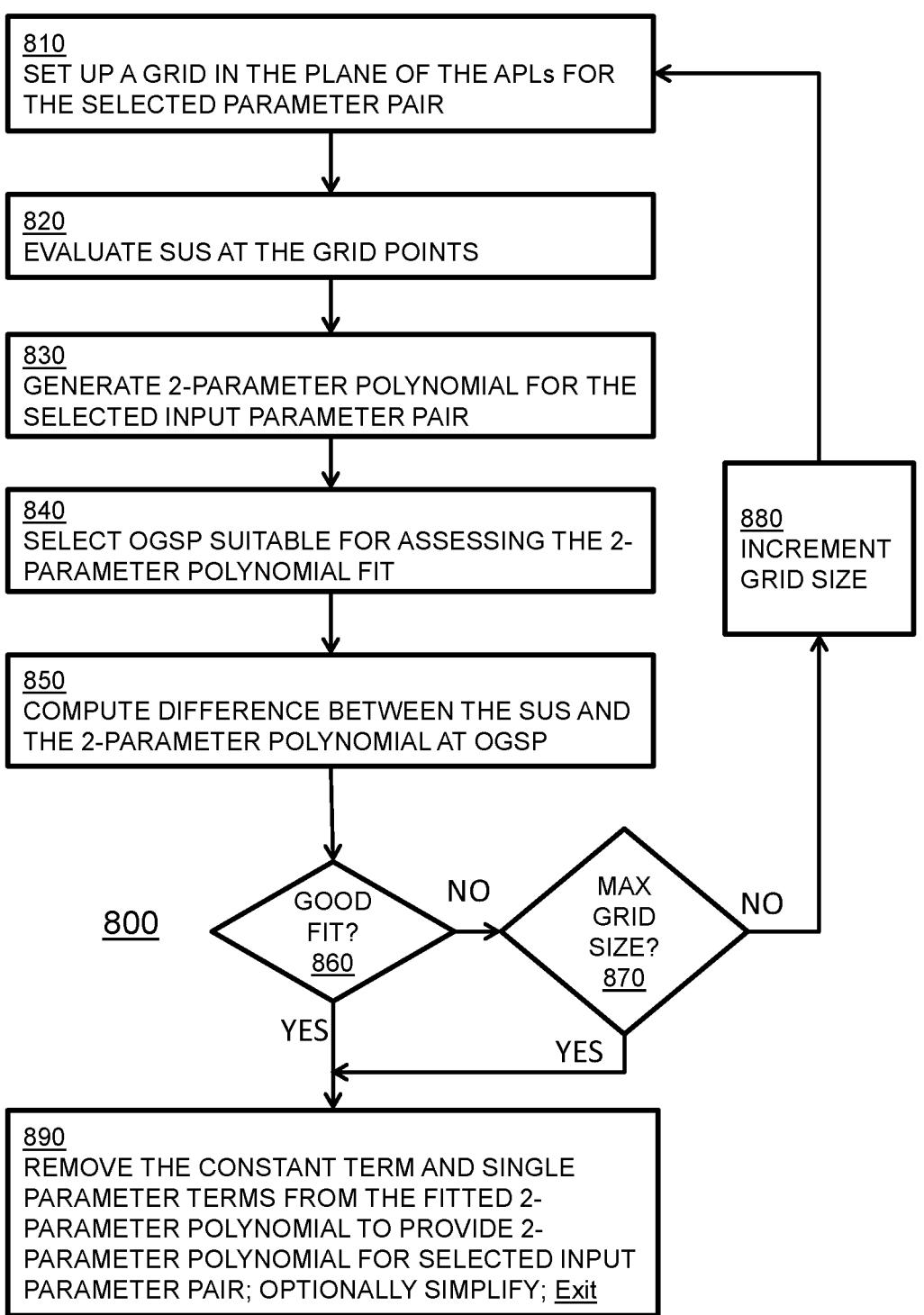
FIG. 8 depicts a flow diagram of a method of generating a 2-parameter polynomial for a selected input parameter pair according to one embodiment.

FIG. 8 depicts a flow diagram of a method of generating a 2-parameter polynomial for a selected input parameter pair according to one embodiment. Specifically, the method 800 of FIG. 8 (and various modifications thereto) is suitable for use in implementing step 760 of the methods 700A-700B of FIGS. 7A-7B.

At step 810, the method 800 (e.g., via the TVE) sets up, illustratively, a K1 by K2 grid centered on the CP in the plane of the axis parallel lines APLs for the input parameters u and v identified in step 750. Here, K1 and K2 are positive integers greater than or equal to 2. The grid has K1 points along the APL for parameter u and K2 points along the APL for parameter v.

Figure 9A:
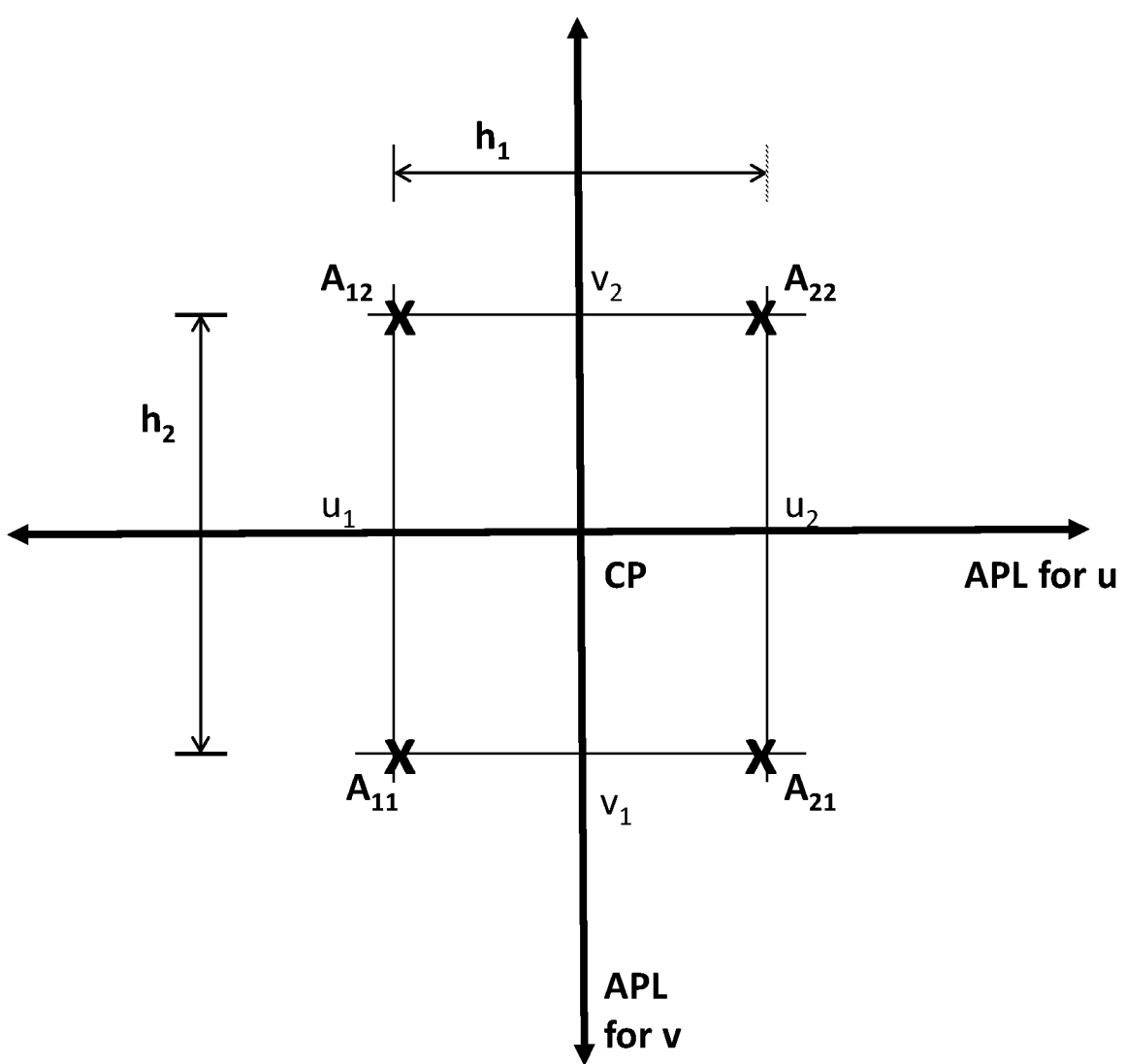
FIGS. 9A-9B graphically depict two-dimensional n-point distributions useful in understanding the various embodiments.
Figure 9B:
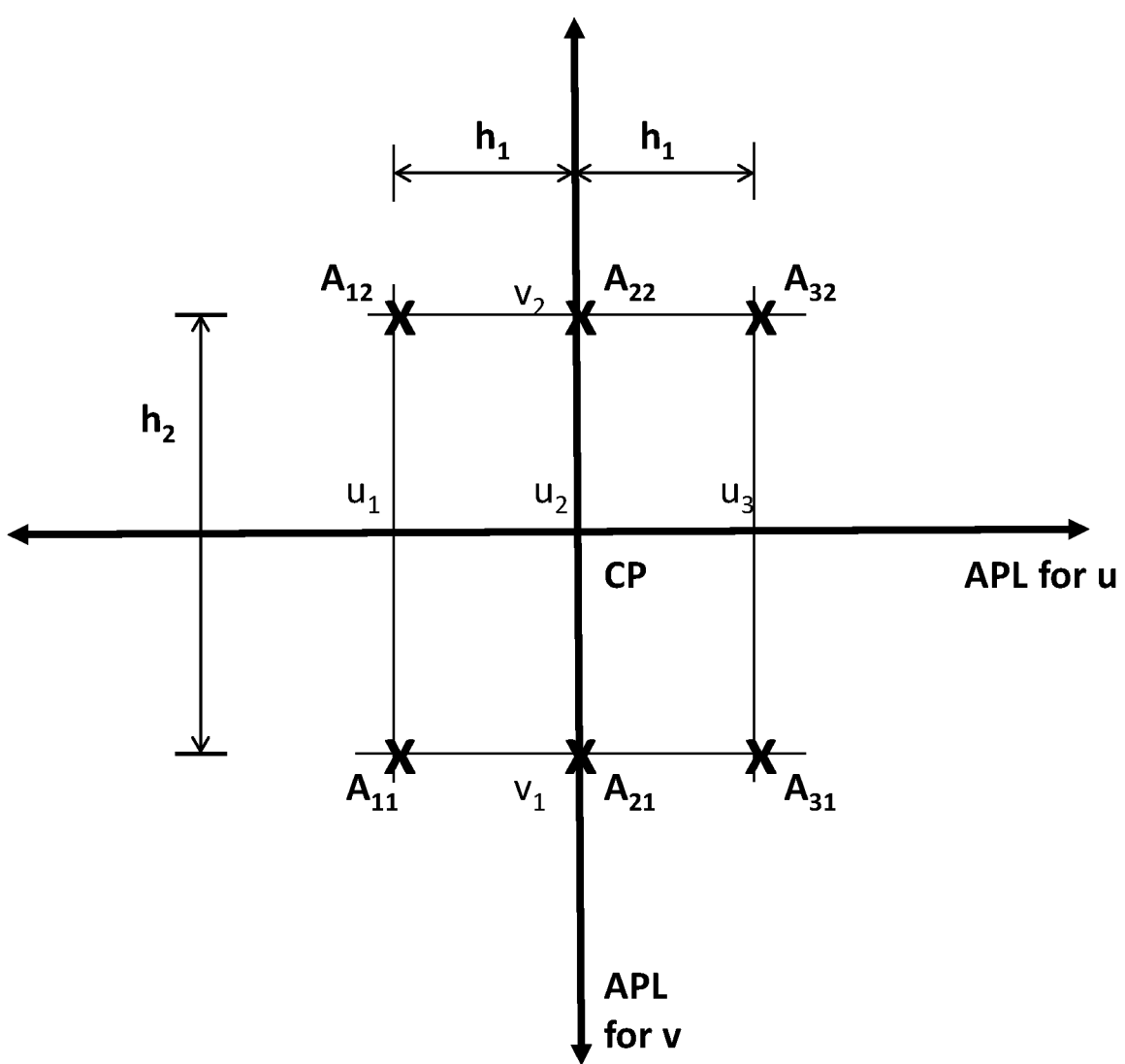

FIGS. 9A-9B graphically depict two-dimensional n-point distributions useful in understanding the various embodiments.

FIG. 9A graphically depicts an embodiment where K1=2 and K2=2. The grid points are labeled $A_{ij}$ for i=1, 2 and j=1, 2. Next, method 800 (e.g., via the TVE) generates vectors with DL components corresponding to the values of the DL input parameters for each of the K1 by K2 (K1×K2) grid points. The values of the input parameters u and v may be set equal to the corresponding coordinates of the grid points. The values of the other input parameters may be set at the corresponding coordinates of the CP.

The grid points are also referred to as model generation points as they may be used for fitting a polynomial model. In essence, these model generation points may be 2-dimensional grid points.

At step 820, the method 800 (e.g., via the HSSHI) evaluates the SUS at the grid points. For example, let $y_{ij}$ denote the SUS values at $A_{ij}$ for i=1, 2 and j=1, 2.

At step 830, the method 800 (e.g., via the EQE) computes the two parameter polynomial. For the above example, the polynomial to be fitted is expressed as follows:

$$y = \sum_{q=0 \text{ to } 1} \sum_{r=0 \text{ to } 1} \{b_{qr}(u-\bar{u})^q (v-\bar{v})^r\} \qquad \text{(Eq. 16)}$$

where $b_{qr}$ for q=0, 1 and r=0, 1 are coefficients; $\bar{u}$ is the average of $u_1$, and $u_2$; and $\bar{v}$ is the average of $v_1$, and $v_2$.

The four SUS evaluations $y_{ij}$ provide four linear equations, represented by Eq.17, in four unknowns, as follows:

$$y_{ij} = \sum_{q=0 \text{ to } 1} \sum_{r=0 \text{ to } 1} \{b_{qr}(u_i-\bar{u})^q (v_j-\bar{v})^r\} \qquad \text{(Eq. 17)}$$

$$\text{for } i = 1, 2 \text{ and } j = 1, 2.$$

It will be appreciated by one skilled in the art that Eq. 17 represents four equations corresponding to (i=1 and j=1), (i=1 and j=2), (i=2 and j=1), and (i=2 and j=2).

The method 800 (e.g., via the EQE) solves these equations by the standard methods of solving simultaneous linear equations such as matrix inversion, successive substitution, and others.

Another technique that may be utilized to fit a polynomial is to rewrite Eq. 17 as a sum of the product of orthogonal polynomials, such as per the following equation, where $P_q$ and $Q_r$ are orthogonal polynomials, such as determined by the EQE using the method described above with respect to the 1FA process of method 500 of FIG. 5:

$$y = \sum_{q=0 \text{ to } 1} \sum_{r=0 \text{ to } 1} \{B_{qr}P_q(u-\bar{u})Q_r(v-\bar{v})\} \qquad \text{(Eq. 18)}$$

$$\text{where } P_0(u-\bar{u}) = 1 \qquad \text{(Eq. 19A)}$$

$$P_1(u-\bar{u}) = (u-\bar{u}) \qquad \text{(Eq. 19B)}$$

$$Q_0(v-\bar{v}) = 1 \qquad \text{(Eq. 19C)}$$

$$Q_1(v-\bar{v}) = (v-\bar{v}) \qquad \text{(Eq. 19D)}$$

To calculate the coefficients $B_{\alpha\beta}$ (for $\alpha$=0, 1 and $\beta$=0, 1), EQE multiplies both sides of Eq. 18 by $P_\alpha(u-\bar{u})$ and $Q_\beta(v-\bar{v})$ and sums both sides over all grid points. The solution for $B_{\alpha\beta}$ is:

$$B_{\alpha\beta} = (\text{numerator\_Eq20}) / (\text{denominator\_Eq20}) \qquad \text{(Eq. 20)}$$

$$\text{where numerator\_Eq20} = \left\{ \sum_{i=1 \text{ to } 2} \sum_{j=1 \text{ to } 2} \{y_{ij}P_\alpha(u_i-\bar{u})Q_\beta(v_j-\bar{v})\} \right\}$$

$$\text{denominator\_Eq20} = \left\{ \sum_{i=1 \text{ to } 2} P_\alpha^2(u_i-\bar{u}) \right\} \left\{ \sum_{j=1 \text{ to } 2} Q_\beta^2(v_j-\bar{v}) \right\}$$

In various embodiments, illustratively for convenience of evaluation of the SUS, the model generation points may be selected as indicated above with some offset causing the model generation points to be close to the plane of the axis parallel lines, but not exactly on the plane. In subsequent analyses, such as generation of polynomials, the model generation points may be treated as though they are exactly on the plane of the axis parallel lines at the specified locations. In various embodiments, for subsequent analyses the actual coordinates of the model generation points are used in conjunction with general linear models analysis.

At step 840, the method 800 (e.g. via the TVE) selects one or more Off Grid Stress Points OGSP, which are points in the plane of the APLs of input parameters u and v that do not coincide with the grid points generated in step 810, that are suitable to assess goodness of the 2-parameter polynomial generated in step 830 for mathematically characterizing the SUS in the plane of the APLs of the input parameters u and v.

At step 850 the method 800 (e.g., via the HSSHI) evaluates the SUS and the 2-parameter polynomial at the OGSP.

In various embodiments such as where the SUS is a hardware system, the evaluations of the SUS at the model generation points, SP, ASP, OGSP, APL points, grid points, RSP, and the like may be repeated (e.g. SUS evaluated more than once at the relevant points). In these embodiments, the average of the evaluations at each point and/or the individual data values may be used for model building or evaluations of fit, as appropriate.

At step 850, the method 800 (e.g., via the EQE) computes the difference between evaluations of the SUS and evaluations of the 2-parameter polynomial computed in step 830 at the corresponding OGSP.

At step 860, the method 800 (e.g., via the EQE) evaluates if the difference computed in step 850 is indicative of a good fit (i.e., within User, System or default specifications). If it is a good fit, then the method 800 proceeds to exit at step 890. Otherwise, the method 800 proceeds to step 870.

At step 870, the method 800 determines if a maximum grid size has been reached. That is, in some embodiments, a User specified, System specified or default maximum polynomial order is provided via, illustratively, default settings, configurations, or by means of Constraints. If a maximum polynomial order is specified, the process checks the limits in step 870. If maximum order is reached, the method 800 moves to step 890. If maximum polynomial order is not reached, the method 800 moves to step 880. At step 880 the grid size is incremented by increasing K1, K2, or both by one or more (making sure that K1 and K2 stay within their respective limits) and the process loops back to step 810.

In various embodiments, the User or the System may specify the polynomial order to use for u or v or both, in which case, both the starting polynomial order and the maximum polynomial order for the respective input parameter(s) are set equal to the specified polynomial order. For example, if the polynomial order was specified as 4 for u and 6 for v, the starting and maximum values of K1 would be set to 5, and starting and maximum values of K2 would be set to 7. It is noted that the specified orders of u and v can be equal. This may be specified in the default settings, configurations, or by means of Constraints.

At step 890, method 800 removes all single parameter terms and the constant term from the polynomial model generated in the latest step 830.

At step 890, in the case that the origin is not at the CP, the polynomial built in the latest step 830 is transformed by shifting the origin to the center point CP; constant term and single parameter terms in the new coordinates may be removed from the transformed polynomial (i.e., any term that does not involve both transformed input parameters may be removed); and the resulting polynomial is transformed again by shifting the origin back from the CP to the original origin.

Optionally at step 890, the method 800 simplifies the remaining polynomial by evaluating the contribution of each remaining polynomial term and removing any term that does not provide sufficient contribution as specified by the User or System. In various embodiments, the method 800 is adapted such that at step 890, single parameter terms (e.g. terms that do not involve both the parameters in the selected input parameter pair) are not removed. In various embodiments, step 890 may not remove single parameter terms for one iteration, but will remove single parameter terms in another iteration.

At step 890 the method 800 exits.

In various embodiments, step 870 is adapted such that a check flag indicative of attaining maximum grid size is set to "yes" such that method 800 moves from step 870 to step 890 and does not go to step 880. That is, method 800 is adapted to not iterate and increase the polynomial orders.

In various embodiments, step 840 is adapted such that OGSP are not selected. That is, method 800 is adapted to skip step 840. In various embodiments, step 850 is adapted such that computation of difference between the SUS and the polynomial at OGSP is not done. That is, method 800 may be adapted to skip step 850. In various embodiments, step 860 is adapted such that a check flag indicative of a good fit is set to "yes" such that method 800 moves from step 860 to step 890. That is, method 800 is adapted to not iterate and increase the polynomial orders.

It can be appreciated by one skilled in the art that method 800 is similar in process and computation to method 500, except that, one parameter polynomials are generated in method 500 while two parameter polynomials are generated in method 800.

FIG. 9B graphically depicts an embodiment where K1=3 and K2=2. It is noted that the grid points are centered at the CP and are labeled $A_{ij}$ for i=1, 2, 3 and j=1, 2. The process for generating the two parameter polynomial for this embodiment is the same as for the embodiment where K1=2 and K2=2.

It is noted that the grid points may also be referred to as model generation points.

Embodiments of step 220 indicate development of 3FA, 4FA, . . . , NFA models. These processes are indicated by steps 360-380 of the various embodiments of step 220 discussed with respect to FIGS. 3A-3E. The process for building the model has been described in detail for 1FA and 2FA processes. It is contemplated that polynomials of three parameter terms, four parameter terms and so on may readily be generated as required. For 3FA, 4FA, . . . , NFA and the like, model generation points, OGSP, grid points, and RSP will be in the space of increasing dimension respectively. For example, for 3 parameter terms, model generation points and the like will be points in the 3-dimensional (N-dimensional where N is 3) space defined by the APLs of the three respective input parameters. For 4 parameter terms, model generation points and the like will be points in the 4-dimensional hyper space (N-dimensional where N is 4) defined by the APLs of the four respective input parameters. Similarly, for N parameter terms, model generation points and the like will be points in the N-dimensional space defined by the APLs of the N respective input parameters.

Step 360 of methods 300A-300E follows the same processes as those for steps 320 and 340 except that the methods 700A-700B are adapted to build approximation models for higher order terms. For example, for 3FA analysis, step 740 is adapted to one additional dimension (e.g., 3-dimensions instead of 2-dimensions) and interaction analysis is performed for parameter triplets instead of parameter pairs. For 3FA analysis, step 750 is adapted to select the highest ranked parameter triplet instead of a parameter pair. At step 760, a polynomial with three parameter terms is generated instead of a polynomial with two parameter terms. For 3FA analysis, step 770 is adapted so the model is updated with the polynomial with three parameter terms for the selected parameter triplet and the parameter triplet is removed from the candidate parameter triplet list.

The polynomial generation process, discussed in detail for two parameter terms in method 800 is adapted to build approximation models for higher order terms. For example, for 3FA analysis, step 810 is adapted to set up a three dimensional grid in the space defined by the APLs for the selected parameter triplet instead of a two dimensional grid. Step 830 is adapted to generate a 3-parameter polynomial for the selected input parameter triplet instead of a 2 parameter polynomial for the selected input parameter pair. Step 840 is adapted so the OGSP are in the 3 dimensional space instead of the 2 dimensional plane. Step 890 may be adapted to remove the constant term, the 1-parameter terms, and the 2-parameter terms as opposed to removing the constant term and the 1-parameter terms. That is, when building a polynomial for a 3-tuplet of input parameters, step 890 may be adapted such that some or all of those polynomial terms that are missing one, two or all three input parameters may be removed. For example, in various embodiments of building a polynomial for a N-tuplet of input parameters, some or all of those polynomial terms that do not use all of the N input parameters from the selected N-tuplet parameters may be removed from further consideration and/or inclusion in the NFA model being improved. For NFA analysis in step 360, model fit methods 700A-700B and polynomial generation method 800 are appropriately adapted to the N level dimension. If N is equal to 5, then the model generation points, the OGSP, the number of parameters in the polynomial term, and so on for the methods are appropriately adapted to the $5^{th}$ dimension. Those skilled in the art will readily be able to follow the methods describe herein to any $N^{th}$ dimension model fit and polynomial generation.

In various embodiments, the terminology N-tuplet of input parameters, where N is an integer greater than 0, is used to refer to a group of N input parameters. When N=1, N-tuplet it refers to a single input parameter; when N=2, N-tuplet refers to a pair of input parameters; when N=3, N-tuplet refers to a triplet of input parameters; and so on.

In various embodiments, the terminology N-dimensional space, where N is an integer greater than 0, is used while working with NFA process. When N=1, N-dimensional space stands for a straight line. When N=2, N-dimensional space stands for a plane. When N=3, N-dimensional space refers to a 3-dimensional space. When N>3, N-dimensional space stands for an N-dimensional hyper space.

In various embodiments, in methods 400A-400B described herein with respect to FIGS. 4A and 4B, the approximation model at steps 420, 430, 440, 450, 460, 470, 480, and 485 may be referred to as the current approximation model. In various embodiments, the approximation model at steps 490 may be referred to as the improved approximation model.

In various embodiments, in methods 700A-700B described herein with respect to FIGS. 7A and 7B, the approximation model at steps 720, 730, 740, 750, 760, 770, 780, and 785 may be referred to as the current approximation model. In various embodiments, the approximation model at steps 790 may be referred to as the improved approximation model.

Figure 10:
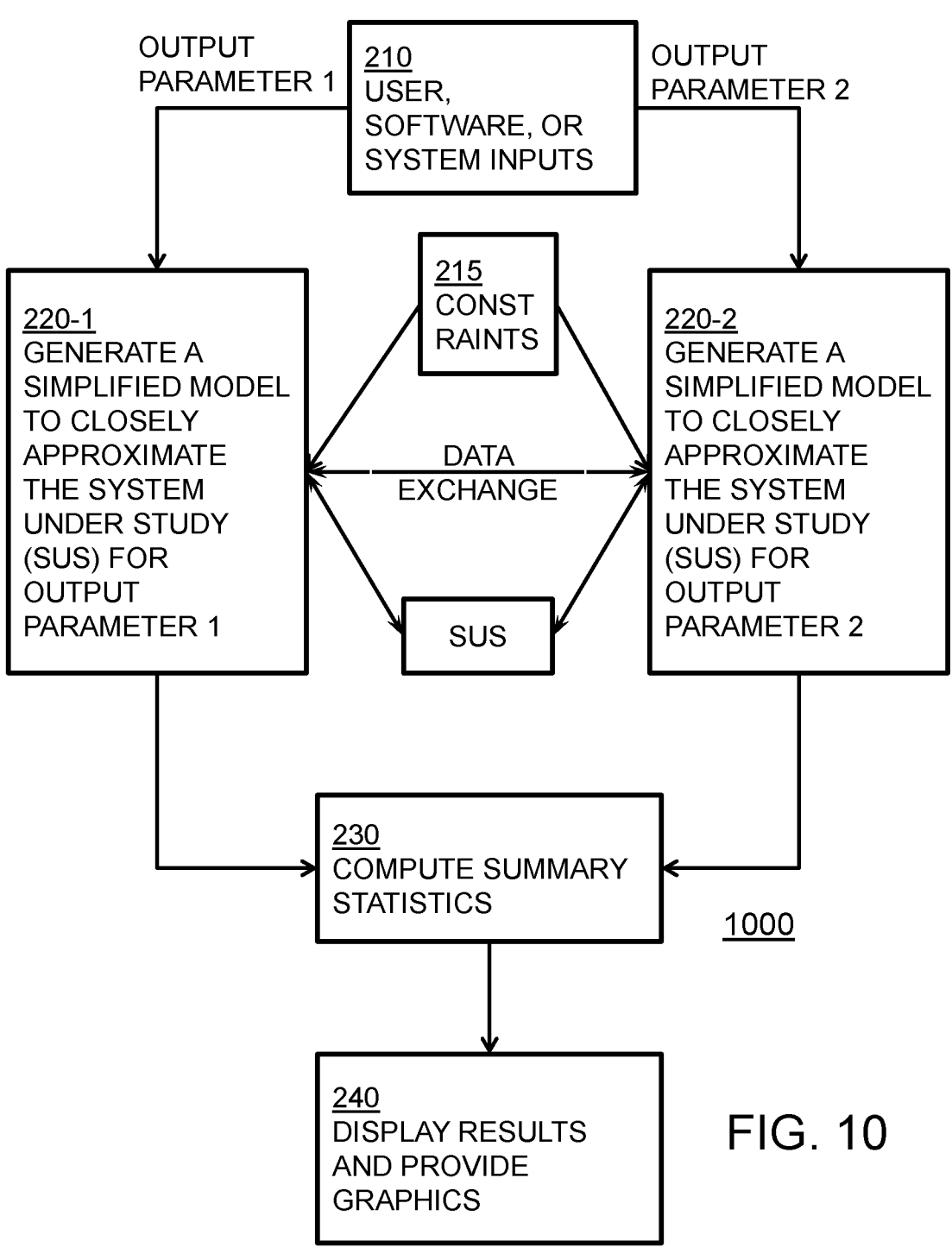
FIG. 10 depicts a flow diagram of a method of processing two output parameters according to various embodiments.

FIG. 10 depicts a flow diagram of a method of processing two output parameters according to various embodiments. In particular, the method 1000 of FIG. 10 contemplates a User or System specifying, e.g., two output parameters within the context of the RACE mechanisms. Generally speaking, if the User supplies two output parameters, step 220 is executed for each output parameter. Some data exchanges and computations such as SUS evaluation information, stress points SP, and other data may be shared and/or coordinated between the step 220-1 execution for output parameter 1 and step 220-2 execution for output parameter 2. This information can be used to reduce data required, improve accuracy, or for other purposes. If a User or System specifies four output parameters, step 220 may be executed for each of the four output parameters.

For each output parameter, User or System may have specified different goodness of fit criteria or Constraints. It is envisioned that for one output, the method 1000 may proceed to a particular analysis level while for another output parameter the method 1000 may proceed to a different analysis level. For example, the method 1000 may proceed to a 2FA process for one output parameter while for another output parameter the method 1000 may proceed to a 4FA process. This may be due to the fact that the goodness of fit criteria is achieved earlier for one output parameter or it may be due to another one of the logical checks in the methods described.

FIG. 11 graphically depicts a flow diagram of method 1100 of generating evaluation points, generating model generation points, generating stress points, generating input vectors, and evaluating a SUS, SCMM, CSCMM, NFA models, and the like according to one embodiment and suitable for use in implementing step 310 and other steps in various figures. Various other methods and mechanisms for generating vectors, selecting stress points, evaluating SUS, SCMM, CSCMM, NFA models, and so on are described herein.

At step 1110, method 1100 (e.g. via the TVE) generates evaluation points or stress points such as model generation points, APL points, grid points, SP, ASP, RSP, OGSP and the like using one or more methods/mechanisms, such as orthogonal array design, fractional factorial design, full factorial design, space filling design and/or other design mechanisms. Generally speaking, these methods/mechanisms are adapted to provide input vectors comprising input parameters within one or more regions of interest.

At step 1120, method 1100 (e.g. via the TVE) generates a plurality of input vectors corresponding to the points generated in step 1110 within one or more regions of interest.

At step 1130, the SUS, current SUS-characterizing mathematical model CSCMM, NFA model, and/or SCMM is evaluated at each of the input vectors within one or more regions of interest.

Generally speaking, SUS and SUS approximations are evaluated at the generated input vectors (i.e., sets of input parameters) within the one or more regions of interest to provide thereby corresponding output vectors (i.e., sets of outputs).

FIG. 12 describes a method of post-processing SUS characterizing information according to one embodiment. That is, the method 1200 of FIG. 12 illustrates a use of SUS characterizing information such as described above with respect to the various figures. Other post-processing methodologies using the information described herein are also contemplated by the inventors.

At step 1210, SUS characterizing information is generated according to any of the techniques described above with respect to the various figures to provide thereby SUS characterizing information comprising, illustratively, an SUS-characterizing mathematical model in an equation format for each output parameter, various input parameters and distributions of input parameter values, ranges/regions of interest of various input parameters and other information.

The SUS characterizing information may be generated in real time and communicated to one or more post-processing functional elements/modules. The SUS model information may have been previously generated and stored (e.g. Model Data 122-MD, Engine Data 122-ED, and the like), in which case the SUS characterizing information is retrieved from the appropriate storage location/module.

At step 1220, the generated/retrieved SUS characterizing information is provided to one or more post-processing functional elements/modules (e.g., activation server 107 or another external data storage and/or processing device) for post-processing, storage for later post-processing and/or storage.

At step 1230, the activation server 107 and/or another external data storage and/or processing device processes the SUS characterizing information to responsively generate summary data or other useful data, such as by using the equation(s) and associated information. Summary data can include minima, maxima, mean, standard deviation, variance, inflection points, zeroes of the equation, transformations of the equation, percentile data, confidence intervals, integrals of equations, derivatives of equations, factor effects, interaction effects, and other data of interest.

At step 1240, SUS-related summary data may be output from the one or more post-processing functional elements/modules for communication to the SUS, another system, one or more end users and the like. Additionally, algorithms and decision processes of the SUS and/or another system may be updated using the summary data. Additionally, the input parameters, regions of interest or other SUS characterizing information may be adapted and the methodology rerun. This adaptation may be responsive to new information of any type, changes in the SUS, user requirements/demands or other information.

Various embodiments contemplate multiple iterations within and/or across one or more of a plurality of approximations models (e.g., 1FA, 2FA, . . . , NFA). Further, various embodiments contemplate that the approximation models iterated thereby may be repeated and/or iterated in a non-sequential manner (e.g., 1FA, then 2FA then 1FA again, then 3FA and so on). That is, while a NFA model is normally determined prior to a (N+1)FA model, the various steps to provide any of the models may be repeated and, more particularly, may be repeated in any order.

Figure 13:
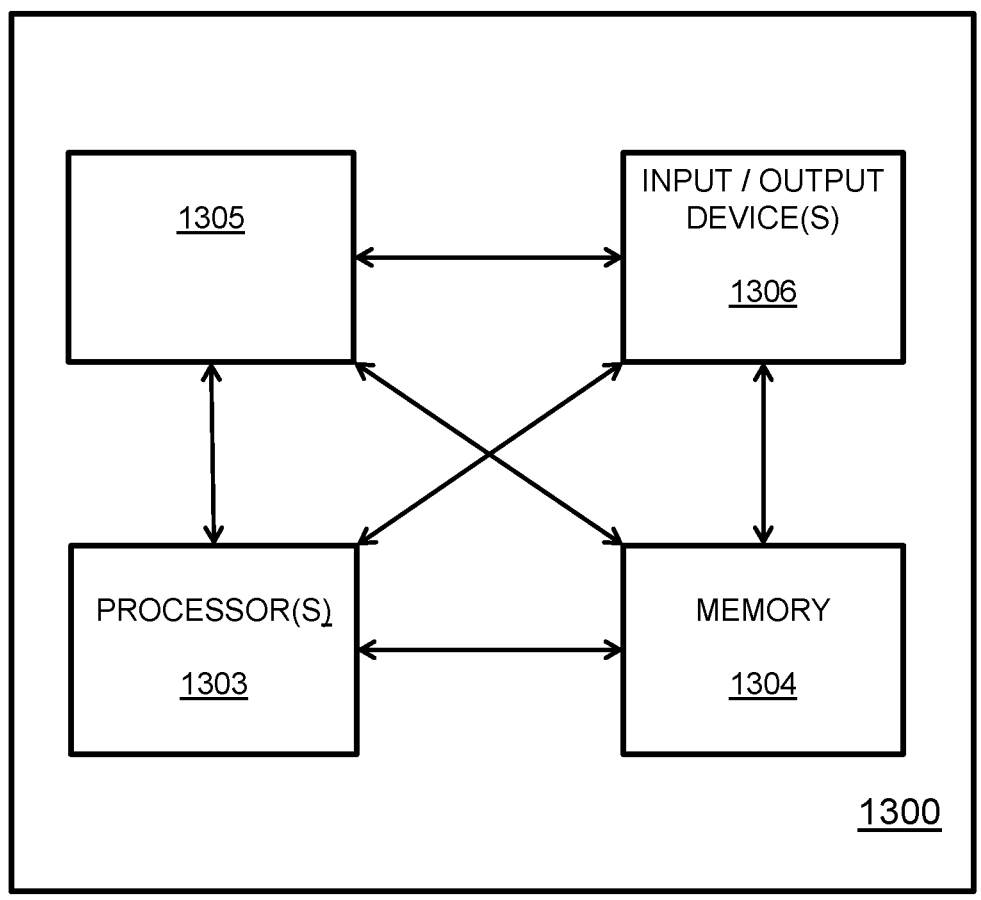
FIG. 13 depicts a high-level block diagram of a computing device suitable for use in performing functions described herein with respect to the various embodiments.

FIG. 13 depicts a high-level block diagram of a computing device, such as a processor in a server or other computing device, suitable for use in performing functions described herein such as those associated with the various elements described herein with respect to the figures.

As depicted in FIG. 13, computing device 1300 includes a processor element 1303 (e.g., a central processing unit (CPU) and/or other suitable processor(s)), a memory 1304 (e.g., random access memory (RAM), read only memory (ROM), and the like), a cooperating module/process 1305, and various input/output devices 1306 (e.g., a user input device (such as a keyboard, a keypad, a mouse, and the like), a user output device (such as a display, a speaker, and the like), an input port, an output port, a receiver, a transmitter, and storage devices (e.g., a persistent solid state drive, a hard disk drive, a compact disk drive, and the like)).

It will be appreciated that the functions depicted and described herein may be implemented in hardware and/or in a combination of software and hardware, e.g., using a general purpose computer, one or more application specific integrated circuits (ASIC), and/or any other hardware equivalents. In one embodiment, the cooperating process 1305 can be loaded into memory 1304 and executed by processor 1303 to implement the functions as discussed herein. Thus, cooperating process 1305 (including associated data structures) can be stored on a computer readable storage medium, e.g., RAM memory, magnetic or optical drive or diskette, and the like.

It will be appreciated that computing device 1300 depicted in FIG. 13 provides a general architecture and functionality suitable for implementing functional elements described herein or portions of the functional elements described herein.

It is contemplated that some of the steps discussed herein may be implemented within hardware, for example, as circuitry that cooperates with the processor to perform various method steps. Portions of the functions/elements described herein may be implemented as a computer program product wherein computer instructions, when processed by a computing device, adapt the operation of the computing device such that the methods and/or techniques described herein are invoked or otherwise provided. Instructions for invoking the inventive methods may be stored in tangible and non-transitory computer readable medium such as fixed or removable media or memory, and/or stored within a memory within a computing device operating according to the instructions.

Various modifications may be made to the systems, methods, apparatus, mechanisms, techniques and portions thereof described herein with respect to the various figures, such modifications being contemplated as being within the scope of the invention. For example, while a specific order of steps or arrangement of functional elements is presented in the various embodiments described herein, various other orders/arrangements of steps or functional elements may be utilized within the context of the various embodiments. Further, while modifications to embodiments may be discussed individually, various embodiments may use multiple modifications contemporaneously or in sequence, compound modifications and the like.

The various embodiments discussed above provide significant advantages within context of numerous types of analysis or modeling applications/uses, including weather prediction, machine/engine performance analysis, voice compression/evaluation, video compression/evaluation, automobile, aircraft or other machine/system performance under various operating conditions, product manufacturing yield, environmental and other resource management and so on.

Although various embodiments which incorporate the teachings of the present invention have been shown and described in detail herein, those skilled in the art can readily devise many other varied embodiments that still incorporate these teachings. Thus, while the foregoing is directed to various embodiments of the present invention, other and further embodiments of the invention may be devised without departing from the basic scope thereof. As such, the appropriate scope of the invention is to be determined according to the claims.

What is claimed is:

1. A computer implemented method for generating an improved System Under Study (SUS) characterizing mathematical model (SCMM), the SUS being characterized comprising one of a mechanical system, an electrical system, a chemical system, a biological system, and an electromechanical system, the SUS operative to exhibit at least one output adapted in response to a plurality of input parameters, the SCMM configured to represent SUS behavior responsive to the plurality of input parameters and resulting in the exhibiting of at least one output, the method comprising:

loading, into a non-transitory computer readable storage medium of a computer, data representing a list of candidate input parameters associated with the SUS;

loading, into the non-transitory computer readable storage medium, data representing an initial SCMM; and generating an improved SCMM comprising a summation of the initial SCMM and a plurality of polynomials, each polynomial being associated with a respective N-tuplet of candidate input parameters for greater than zero integer values of N;

wherein polynomials included within said improved SCMM are generated by iteratively performing the following steps until an evaluated difference between respective sets of output parameters generated in response to a common set of input parameters by a current SCMM (CSCMM) and the SUS being characterized is below a threshold level:

rank ordering the N-tuplets of input parameters to be processed;

selecting model generation points for a highest ranking N-tuplet of input parameters from among the rank ordered N-tuplets of input parameters to be processed;

causing the SUS to generate a set of output parameters in response to input parameters associated with the selected model generation points, fitting a polynomial involving the selected N-tuplet of input parameters to the SUS generated set of output parameters;

updating the CSCMM by adding the fitted polynomials; and evaluating fit of the CSCMM to the SUS by:

selecting a set of stress points by varying the input parameters, causing the CSCMM and the SUS to generate respective sets of output parameters in response to the selected stress points, and comparing the CSCMM generated set of output parameters to the SUS generated set of output parameters to determine a difference therebetween.

2. The computer implemented method of claim 1, wherein fitting a polynomial involving the selected N-tuplet of input parameters to the SUS generated set of output parameters comprises:

iteratively performing the following steps until an evaluated difference between respective sets of output parameters generated in response to a common set of input parameters by the CSCMM and the SUS being characterized is below a threshold level:

selecting a plurality of model generation points in the N-dimensional space defined by axis parallel lines of the selected N-tuplet of input parameters, where the selected model generation points are incremented by one or more for subsequent iterations in the N-dimensional space;

evaluating the CSCMM at the selected model generation points;

fitting a polynomial involving input parameters from the N-tuplet of input parameters to the CSCMM evaluation;

evaluating a fit of the polynomial to the SUS; and removing polynomial terms that do not involve all input parameters from said N-tuplet of input parameters.

3. The computer implemented method of claim 1, wherein rank ordering is determined according to a difference between evaluations of the set of output parameters generated by the CSCMM to the outputs of the SUS at a plurality of selected ranking stress points, the ranking stress points generated using at least one of orthogonal array design, fractional factorial design, full factorial design, design of experiments, and space filling designs.

4. The computer implemented method of claim 1, wherein rank ordering is determined according to at least one of importance, presumed importance, random order, past data, alphabetical order, and order of entry.

5. The computer implemented method of claim 4, wherein importance of input parameters is determined by main effects analysis of the difference between the set of output parameters generated by the CSCMM to the outputs of the SUS at ranking stress points.

6. The computer implemented method of claim 4, wherein importance of N-tuplets of input parameters is determined by analyzing effects of interactions among the N-tuplets of input parameters for each corresponding output parameter of the CSCMM and the SUS at ranking stress points.

7. The computer implemented method of claim 1, wherein fitting a polynomial involving input parameters in the selected N-tuplet of input parameters is performed using at least one of orthogonal polynomials, matrix inversion, Lagrange polynomials, and solving simultaneous equations.

8. The computer implemented method of claim 1, wherein evaluated difference is determined by goodness of fit criteria comprising at least one of a maximum absolute difference, a sum of absolute differences, a mean square of selected top absolute differences, and a mean square error.

9. The computer implemented method of claim 1, wherein the SUS comprises a machine and the model comprises a machine performance model, the machine comprising one of an engine, an automobile, and an aircraft.

10. The computer implemented method of claim 1, wherein the SUS comprises an article of manufacture having a plurality of assemblies, wherein each of the assemblies comprises a plurality of components, and wherein the model represents the article of manufacture, assemblies, and components.

11. The computer implemented method of claim 1, wherein the SUS comprises a product manufacturing system and the model comprises a product manufacturing model.

12. The computer implemented method of claim 1, wherein the SUS comprises a voice or video compression system and the model comprises a voice or video compression model.

13. The computer implemented method of claim 1, wherein the SUS comprises a weather prediction system and the model comprises a weather prediction model.

14. A computer implemented method for generating an improved System Under Study (SUS) characterizing mathematical model (SCMM), the SUS being characterized comprising one of a mechanical system, an electrical system, a chemical system, a biological system, and an electromechanical system, the SUS operative to exhibit at least one output adapted in response to a plurality of input parameters, the SCMM configured to represent SUS behavior responsive to the plurality of input parameters and resulting in the exhibiting of the at least one output, the method comprising:

loading, into the non-transitory computer readable storage medium of a computer, data representing a list of candidate input parameters associated with the SUS;

loading, into a non-transitory computer readable storage medium, data representing an initial SCMM;

generating an improved SCMM comprising a summation of the initial SCMM and a plurality of complex function elements, each complex function element being associated with a respective N-tuplet of candidate input parameters for greater than zero integer values of N;

wherein complex function elements included within said improved SCMM are generated by iteratively performing the following steps until an evaluated difference between respective sets of output parameters generated in response to a common set of input parameters by a current SCMM (CSCMM) and the SUS being characterized is below a threshold level:

rank ordering the N-tuplets of input parameters to be processed;

selecting model generation points for a highest ranking N-tuplet of input parameters from among the rank ordered N-tuplets of input parameters to be processed;

causing the SUS to generate a set of output parameters in response to input parameters associated with the selected model generation points, fitting a complex function element involving the selected N-tuplet of input parameters to the SUS generated set of output parameters;

updating the CSCMM by adding the fitted complex function elements; and evaluating fit of the CSCMM to the SUS by:

selecting a set of stress points by varying the input parameters, causing the CSCMM and the SUS to generate respective sets of output parameters in response to the selected stress points, and comparing the CSCMM generated set of output parameters to the SUS generated set of output parameters to determine a difference therebetween.

15. The computer implemented method of claim 14, wherein the complex function elements are associated with one of a polynomial function, a wavelet function, a Fourier series, and a Walsh function.

16. The computer implemented method of claim 1, further comprising:

prior to evaluating fit of the SCMM to the SUS, adjusting a constant term to match the evaluations of the SUS and the CSCMM at a point.

17. The computer implemented method of claim 14, further comprising:

prior to evaluating fit of the SCMM to the SUS, adjusting a constant term to match the evaluations of the SUS and the CSCMM at a point.

18. A computer implemented method of generating a model of a physical system, the physical system comprising one of a mechanical system, an electrical system, a chemical system, a biological system, and an electromechanical system, the method comprising:

receiving an input dataset comprising data representing a list of candidate input parameters associated with the physical system and data representing an initial model of the physical system, the initial model of the physical system comprising a plurality of polynomials, each polynomial being associated with a respective N-tuplet of candidate input parameters for greater than zero integer values of N; and generating an output dataset associated with an improved model by iteratively performing the following steps until an evaluated difference between respective sets of output parameters generated in response to a common set of input parameters by a current model and the physical system is below a threshold level:

rank ordering the N-tuplets of input parameters to be processed;

selecting model generation points for a highest ranking N-tuplet of input parameters from among the rank ordered N-tuplets of input parameters to be processed;

causing the current model to generate a set of output parameters in response to input parameters associated with the selected model generation points, fitting a polynomial involving the selected N-tuplet of input parameters to the set of output parameters generated by the current model;

updating the current model by adding the fitted polynomials; and evaluating fit of the current model to the physical system by:

selecting a set of stress points by varying the input parameters, causing the current model and the physical system to generate respective sets of output parameters in response to the selected stress points, and comparing the set of output parameters generated by the current model to the set of output parameters generated by the physical system to determine a difference therebetween.

* * * * *